(12) United States Patent
Landheer et al.

(10) Patent No.: US 10,768,250 B2
(45) Date of Patent: Sep. 8, 2020

(54) TECHNIQUES FOR OPERATING MAGNETIC RESONANCE IMAGERS TO CRUSH RETURNS FROM UNWANTED COHERENCE PATHWAYS

(71) Applicant: The Trustees of Columbia University in the City of New York, New York, NY (US)

(72) Inventors: Karl Landheer, New York, NY (US); Christoph Juchem, Ridgefield, CT (US)

(73) Assignee: THE TRUSTEES OF COLUMBIA UNIVERSITY IN THE CITY OF NEW YORK, New York, NY (US)

( * ) Notice: Subject to any disclaimer, the term of this patent is extended or adjusted under 35 U.S.C. 154(b) by 0 days.

(21) Appl. No.: 16/223,626

(22) Filed: Dec. 18, 2018

(65) Prior Publication Data
US 2019/0204400 A1     Jul. 4, 2019

Related U.S. Application Data

(60) Provisional application No. 62/612,104, filed on Dec. 29, 2017.

(51) Int. Cl.
*G01V 3/00*     (2006.01)
*G01R 33/46*     (2006.01)
(Continued)

(52) U.S. Cl.
CPC ....... *G01R 33/4616* (2013.01); *G01R 33/446* (2013.01); *G01R 33/4608* (2013.01); *G01R 33/543* (2013.01); *G01R 33/4833* (2013.01)

(58) Field of Classification Search
USPC .......................................... 324/307
See application file for complete search history.

(56) References Cited

U.S. PATENT DOCUMENTS 6,373,250 B1 * 4/2002 Tsoref .................. G01R 33/446
                                                324/307
6,696,889 B2 * 2/2004 Watanabe .......... G01R 33/4608
                                                329/309

(Continued)

OTHER PUBLICATIONS

Mitschang, Lorenz, et al., "Geometrical representation of coherence transfer selection by pulsed field gradients in high-resolution nuclear magnetic resonance", The Journal of Chemical Physics, Feb. 22, 1995, pp. 3089-3098, vol. 102, No. 8, Publisher: American Institute of Physics, Published in: http://dx.doi.org/10.1063/1.468618.

(Continued)

*Primary Examiner* — Rodney E Fuller
(74) *Attorney, Agent, or Firm* — Wolter Van Dyke Davis, PLLC; Eugene J. Molinelli

(57) ABSTRACT

Techniques for crushing unwanted coherence pathways during magnetic resonance spectral (MRS) measurements include receiving first data that indicates a sequence of RF pulses with one or more target coherence pathways of spin states for a subject that has at least N≥1 coupled spin states of interest. A negative, non-integer amplitude is determined for at least one intervening crusher pulse emitted from at least one spatial gradient magnetic coil. The at least one intervening crusher pulse has a duration less than a time between successive pulses of the sequence of RF pulses; and, the intervening crusher pulse de-phases unwanted coherence pathways. A MRS device is operated using the intervening crusher pulse and the sequence of RF pulses.

15 Claims, 11 Drawing Sheets

(51) Int. Cl.
*G01R 33/54* (2006.01)
*G01R 33/44* (2006.01)
*G01R 33/483* (2006.01)

(56) References Cited

U.S. PATENT DOCUMENTS 8,723,516 B2 * 5/2014 Wheaton ............ G01R 33/5607
324/307
2015/0285878 A1 * 10/2015 Gonen ................. G01R 33/485
324/309

OTHER PUBLICATIONS

Thomas, David, et al., "Signal Selection in High-Resolution NMR by Pulsed Field Gradients", 1999, pp. 10-24, vol. 137, Publisher: Journal of Magnetic Resonance.
Zhu, Jian-Ming, et al., "Selection of Coherence Transfer Pathways by Pulse-Field Gradients in NMR Spectroscopy", Concepts in Magnetic Resonance, 1995, pp. 281-291, vol. 7, No. 4, Publisher: John Kiley & Sons, Inc.

* cited by examiner x-gradient y-gradient z-gradient

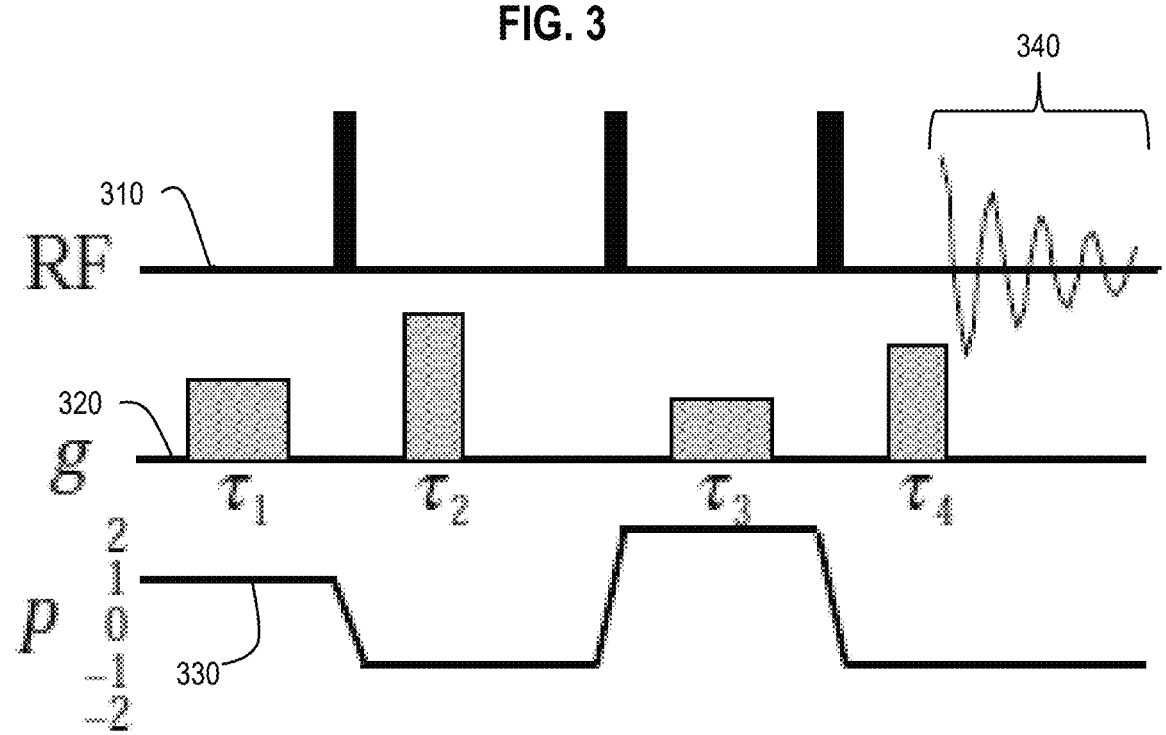

Table 1

| Pulse sequence | Crusher number | Crusher amplitude x axis (mT/m) | Crusher amplitude y axis (mT/m) | Crusher amplitude z axis (mT/m) | Crusher duration (ms) |
|---|---|---|---|---|---|
| sLASER (Scheenen [5] crusher scheme) | 1 | 0.00 | 0.00 | 0.00 | 1.600 |
| | 2 | 0.00 | 0.00 | 0.00 | 1.600 |
| | 3 | 0.00 | 0.00 | 0.00 | 1.600 |
| | 4 | 44.00 | 44.00 | 44.00 | 1.600 |
| | 5 | 44.00 | 44.00 | 44.00 | 1.600 |
| sLASER (novel crusher scheme) | 1 | -44.00 | 44.00 | -44.00 | 1.600 |
| | 2 | 31.93 | 44.00 | -12.07 | 1.600 |
| | 3 | 44.00 | 0.00 | -44.00 | 1.600 |
| | 4 | 12.07 | 44.00 | -31.93 | 1.600 |
| | 5 | 44.00 | 44.00 | 44.00 | 1.600 |
| MEGA-sLASER (Andreychenko [5] crusher scheme) | 1 | 0.00 | 12.00 | 12.00 | 1.276 |
| | 2 | 0.00 | 12.00 | 12.00 | 1.276 |
| | 3 | 24.00 | 0.00 | 12.00 | 1.276 |
| | 4 | 24.00 | 0.00 | 12.00 | 1.276 |
| | 5 | 0.00 | 0.00 | 0.00 | 1.276 |
| | 6 | 24.00 | 24.00 | 24.00 | 1.276 |
| | 7 | 24.00 | 0.00 | 0.00 | 1.276 |
| MEGA-sLASER (optimized crusher scheme constant duration gradients) | 1 | -24.00 | 24.00 | -12.00 | 1.276 |
| | 2 | 0.00 | -22.50 | 24.00 | 1.276 |
| | 3 | -24.00 | 24.00 | 24.00 | 1.276 |
| | 4 | -24.00 | -1.50 | 24.00 | 1.276 |
| | 5 | -24.00 | 24.00 | 24.00 | 1.276 |
| | 6 | 24.00 | -24.00 | 12.00 | 1.276 |
| | 7 | 24.00 | 24.00 | 24.00 | 1.276 |
| MEGA-sLASER (optimized crusher scheme variable duration gradients) | 1 | 24.00 | 20.56 | 24.00 | 1.276 |
| | 2 | 24.00 | 15.14 | 24.00 | 4.096 |
| | 3 | -24.00 | -20.56 | -24.00 | 1.276 |
| | 4 | 24.00 | 24.00 | -1.64 | 1.868 |
| | 5 | -24.00 | -20.56 | -24.00 | 1.276 |
| | 6 | 23.54 | 24.00 | 24.00 | 11.524 |
| | 7 | 4.46 | 24.00 | 24.00 | 2.800 |

FIG. 6

TECHNIQUES FOR OPERATING MAGNETIC RESONANCE IMAGERS TO CRUSH RETURNS FROM UNWANTED COHERENCE PATHWAYS

CROSS-REFERENCE TO RELATED APPLICATIONS

This application claims benefit of Provisional Appln. 62/612,104, filed Dec. 29, 2017, the entire contents of which are hereby incorporated by reference as if fully set forth herein, under 35 U.S.C. § 119(e).

BACKGROUND

The present invention relates to magnetic resonance imaging (MRI), magnetic resonance spectroscopy (MRS) and MRS imaging (MRSI), and in particular to operating magnetic resonance equipment to enhance accuracy of spectral properties by substantially eliminating (termed "crushing" herein) the responses from unwanted coherence order pathways before measuring the nuclear magnetic resonance (NMR) signal. In the following, the base magnetic field or static magnetic field may represent the combination of the external magnetic field and the macroscopic effects of the tissue susceptibility.

Nuclear magnetic resonance studies magnetic nuclei by aligning them with an applied constant magnetic field (B0) in direction z and perturbing this alignment using an alternating magnetic field (B1) at radio frequencies (called RF pulses), orthogonal to z. The resulting response to the perturbing magnetic field is the phenomenon that is exploited in magnetic resonance spectroscopy (MRS) and magnetic resonance imaging (MRI). Spatial distributions of the measured spectroscopy are determined by adding to B0, the strength in the z direction, a spatial gradient of the z direction magnetic field along each of three orthogonal coordinate dimensions (e.g., x, y and z) designated Gx, Gy, Gz, respectively.

The elementary particles, neutrons and protons, composing an atomic nucleus, have the intrinsic quantum mechanical property of spin. The overall spin of the nucleus is determined by the spin quantum number I. If the number of both the protons and neutrons in a given isotope are even, then I=0. In other cases, however, the overall spin is non-zero. A non-zero spin is associated with a non-zero magnetic moment, $\mu$, as given by Equation 1a.

$$\mu = \gamma I \quad (1a)$$

where the proportionality constant, $\gamma$, is the gyromagnetic ratio. It is this magnetic moment that is exploited in NMR. Without an external magnetic field, the spins are randomly oriented. In the presence of a magnetic field, nuclei that have a spin of one-half, like Hydrogen nuclei ($^1H$), have two possible spin states (aligned with the applied field, referred to as spin up, and anti-aligned, referred to as spin down) with respect to the external magnetic filed. The interaction between the nuclear magnetic moment and the external magnetic field means the two states do not have the same energy. The energy difference between the two states is given by Equation 1b.

$$\Delta E = \hbar \gamma B_0 \quad (1b)$$

where $\hbar$ is Plank's reduced constant. While most atoms are still oriented randomly, in thermal equilibrium, more than average atoms will be in the lower energy state and fewer than average in the high energy state imparting a net magnetization vector in the direction of the applied external magnetic field.

Resonant absorption will occur when electromagnetic radiation of the correct frequency to match this energy difference is applied. The energy of photons of electromagnetic radiation is given by Equation 2.

$$E = hf \quad (2)$$

where f is the frequency of the electromagnetic radiation and $h = 2\pi\hbar$. Thus, absorption will occur when the frequency is given by Equation 3.

$$f = \gamma B_0 / (2\pi) \quad (3)$$

The NMR frequency f is shifted by the 'shielding' effect of the surrounding electrons. In general, this electronic shielding reduces the magnetic field at the nucleus (which is what determines the NMR frequency). As a result, the energy gap is reduced, and the frequency required to achieve resonance is also reduced. This shift of the NMR frequency due to the chemical environment is called the chemical shift, and it explains why NMR is a direct probe of chemical structure. Gradually the high energy state nuclei lose their excess energy to the lower state nuclei and return to a random distribution at an exponential decay rate called the T1 relaxation time.

Applying a short electromagnetic pulse in the radio frequency range to a set of nuclear spins induces a transition between states of the spins. In terms of the net magnetization vector (which is due to the fact that while many nuclei are randomly arranged, there is some alignment in the spins, i.e., more nuclei have nuclear magnetic moments aligned than anti-aligned with the field), this corresponds to tilting the net magnetization vector away from its equilibrium position (aligned in the z direction along the external magnetic field, $B_0$). The out-of-equilibrium magnetization vector processes about the external magnetic field at the NMR frequency of the spins. This oscillating magnetization induces a current in a nearby pickup coil acting as a radio frequency (RF) receiver, creating an electrical signal oscillating at the NMR frequency.

A portion of this time domain signal (intensity vs. time), after all radio frequency pulses, is known as the free induction decay (FID) and contains the sum of the NMR responses from all the excited spins and all their chemical shielding effects. In order to obtain the frequency-domain NMR spectrum (intensity vs. frequency) for magnetic resonance spectroscopy (MRS) and MRS imaging (MRSI), this time-domain signal is Fourier transformed. After the RF pulse ends, the energy in the emitted FID signal decreases at an exponential rate called the $T_2$ relaxation time. The $T_2$ relaxation time is the time for precessing nuclei to fall out of alignment with each other (i.e., lose coherence) and thus stop producing a signal.

Spectral resolution refers to the ability to distinguish two closely spaced peaks in any spectrum. It is one of the important criteria that define the quality of MRS and MRSI. Low spectral resolution can obscure the information available from molecules of interest, such as metabolites, in a volume of tissue, thus making difficult or impossible the detection and quantification of some or all of those metabolites.

Within the category of data acquisition, the most commonly employed strategy for improving spectral resolution is the automated techniques for improving the homogeneity of the magnetic field $B_0$. Fast and high order shimming techniques have been implemented on modern scanners to make B0 more uniform across a subject being scanned, yet these methods cannot eliminate all variation in local magnetic fields that are caused by the differing magnetic susceptibilities of various interposed tissues within the body. To image at higher magnetic field strengths is another strategy to increase spectral resolution, as well as improve the signal-to-noise ratio (SNR) of the MRS. Theoretically, doubling the field strength should double the differences in chemical shifts and the separations peaks in the metabolic spectrum. Unfortunately, the observed benefit of higher field strengths in improving spectral resolution is much lower than theoretically predicted. For higher fields, such as 7 Tesla (T, 1 T=1 Newton per Ampere per meter) and above, there is substantially sub-linear spectral resolution improvement. Two reasons for this are that scanners with higher field strengths come with greater inhomogeneity of their magnetic fields, and the higher fields shorten the $T_2$ relaxation times of metabolites, both of which increase linewidths of the spectrum. In addition, the upper limit on field strength is constrained by practical and safety considerations. Techniques of fast acquisition of data can reduce the total scan time and thereby reduce the likelihood that the person being imaged moves, and this will indirectly reduce the line broadening caused by subject motion. Other acquisition-based techniques are designed to overcome these problems, as such higher spatial resolution MRSI is designed to address low spatial resolution, whereas 2dimensional (2D) J-resolved MRSI overcomes the limited spectral resolution to improve spectral resolvability through a second spectral dimension. However, both of these techniques usually require long scan times which cannot be afforded in many clinical and research applications.

A further phenomenon known to affect the accuracy of spectral properties deduced from the FID, include excitation of higher coherence orders. In the simple vector picture of NMR, the phase of a radiofrequency pulse determines the axis along which the magnetic field, B1 appears. Its phase is represented as the angle, β between a reference axis (e.g., x) and the vector representing B1. If the reference axis is chosen to be aligned with the field B1, then β=0. When precessing nuclei particles interact with surrounding spin-coupled particles (also called coupled particle for convenience herein), the phase of the excited particle can affect the phase of the coupled particle, which can in turn be converted to a higher-order coherence through the application of a subsequent RF pulse. Coherence order is given by a signed integer value, p. A coherence of order p experiences a phase shift of $-p\varphi$, where $\varphi$ is the phase of the RF pulse. Single quantum coherence has p=±1, double has p=±2 and so on; z-magnetization, "zz" terms and zero-quantum coherence have p=0. Coherence orders with values not equal to 1 or −1 are referred to as multiple quantum coherences and are simultaneous transitions between energy levels of coupled spins. The RF induces the transition between coherence order of a particular group of spins. An excitation pulse rotates the initial coherence order of the population from 0 to a coherence order of +/−1.

Depending on the particular application, it is routine to apply multiple RF pulses, for coherence pathway selection and for spatial localization. The RF pulses are timed to be in phase with the excitation pulse but short compared to $T_2$. Such successive pulses also can change the coherence order from the order of the original pulse. Thus one or more additional pulses are employed to return the coherence order to +/−1. The coherence order sequence resulting from the RF pulse sequence is called the coherence pathway of the pulse sequence.

Each RF pulse also has the potential to produce multiple order coherences due to interactions among spin coupled particles, and for most applications they generate undesired signal characteristics, thus it is desirable to reduce or eliminate these higher coherence orders between RF pulses. It was recognized that such coherence orders could be suppressed (termed "crushed") in gradient magnetic fields that could be produced by the gradient magnet coils used for spatial distribution, so pulses of gradient magnetic fields, Gx, Gy, Gz, called "crushers" are often employed between RF pulses. After an RF pulse, at the beginning of the gradient pulse, the vectors representing transverse (in x-y plane) magnetization in a voxel are aligned, but after some time each vector has precessed through a different angle because of the variation in resonant frequency. After sufficient time the vectors are disposed in such a way that the net magnetization of the sample (obtained by adding together all the vectors) approaches zero. The gradient pulse is said to have de-phased the magnetization. Gradient pulses are employed to de-phase the coherence pathways other than the target coherence pathway and subsequent RF pulses are used to refocus or re-phase the target coherence pathway.

SUMMARY

In a typical magnetic resonance spectroscopy (MRS) pulse sequence for measurements with an MRS device, a scheme of pulsed magnetic field gradients, or "crushers", are played out during times in-between radiofrequency (RF) pulses to dephase unwanted coherence pathways which are incidentally perturbed by the RF pulses. However, the inventors noted that many existing crusher plans do not properly take care of all noticeable unwanted coherence pathways. Techniques are provided for improving the design and implementation of the crushers.

In a first set of embodiments, a method for making magnetic resonance spectroscopy (MRS) measurements includes receiving first data that indicates a sequence of n radio frequency (RF) pulses with one or more target coherence pathways for making an MRS measurement using a MRS device of a subject that has at least N≥1 coupled nuclei of interest, where N=1 indicates uncoupled spins. The method includes determining a negative non-integer amplitude for at least one intervening crusher pulse emitted from at least one spatial gradient magnetic coil. The at least one intervening crusher pulse has a duration less than a time between successive pulses of the sequence of n RF pulses; and, the intervening pulse de-phases unwanted coherence pathways. The method further includes operating the magnetic resonance device using the at least one intervening crusher pulse and the sequence of n RF pulses. In some of these embodiments, the negative non-integer amplitude is not a negative integer multiple of ½.

In some embodiments of the first set of embodiments, determining the negative non-integer amplitude includes determining the all the crusher pulse amplitudes using an optimizations algorithm. In some of these embodiments, using the optimization algorithm includes determining a matrix A of coherence pathways for n RF pulses and coherence order N comprising matrix elements Aij, i∈(1, . . . , n) and j∈(1, . . . , $(2N+1)^n$). Each j represents a unique coherence pathway, j=K indicates the one or more target coherence pathways, and a value of Aij represents a coherence order of a jth pathway after i RF pulses. Furthermore, determining the negative non-integer amplitude includes determining values for elements Xmi of a matrix X, wherein each element Xmi describes a crusher area for each of 3 orthogonal axes, m∈(1,2,3), after each i of n pulses. The crusher area Xmi is based on a product of a spatial gradient Gmi along the nth axis of an ith crusher pulse and a duration time τmi of the ith crusher pulse. Determining Xmi includes determining for current values of elements of matrix X a vector D with elements Dj, having values that indicate a magnitude of a matrix product of XA for each coherence pathway. Determining Xmi also includes determining a vector D̂ based on D with element DK constrained to a value at or near zero. Still further, determining Xmi includes iterating on values of the elements of matrix X to find a solution matrix X̂ that maximizes a measure of size of D̂ and falls within values achievable by the MRS device and that minimizes DK (the crushing of the target pathway). Determining the negative non-integer amplitude still further includes producing output data that indicates solution matrix X̂, wherein the negative non-integer amplitude is based on at least one element of the solution matrix.

In other embodiments, an apparatus or a computer-readable medium is configured to perform one or more steps of one or more of the above methods.

Still other aspects, features, and advantages are readily apparent from the following detailed description, simply by illustrating a number of particular embodiments and implementations, including the best mode contemplated for carrying out the invention. Other embodiments are also capable of other and different features and advantages, and its several details can be modified in various obvious respects, all without departing from the spirit and scope of the invention. Accordingly, the drawings and description are to be regarded as illustrative in nature, and not as restrictive.

BRIEF DESCRIPTION OF THE DRAWINGS

Embodiments are illustrated by way of example, and not by way of limitation, in the figures of the accompanying drawings in which like reference numerals refer to similar elements and in which:

FIG. 3 is a coherence order pathway diagram that illustrates example time series of RF pulses, crusher pulses and a target coherence pathway, for which crusher pulses are determined, according to an embodiment;

FIG. 6 is a table that illustrates example crusher amplitudes and durations for two well-known RF pulse sequences, according to various embodiments;

DETAILED DESCRIPTION

Figure 1:
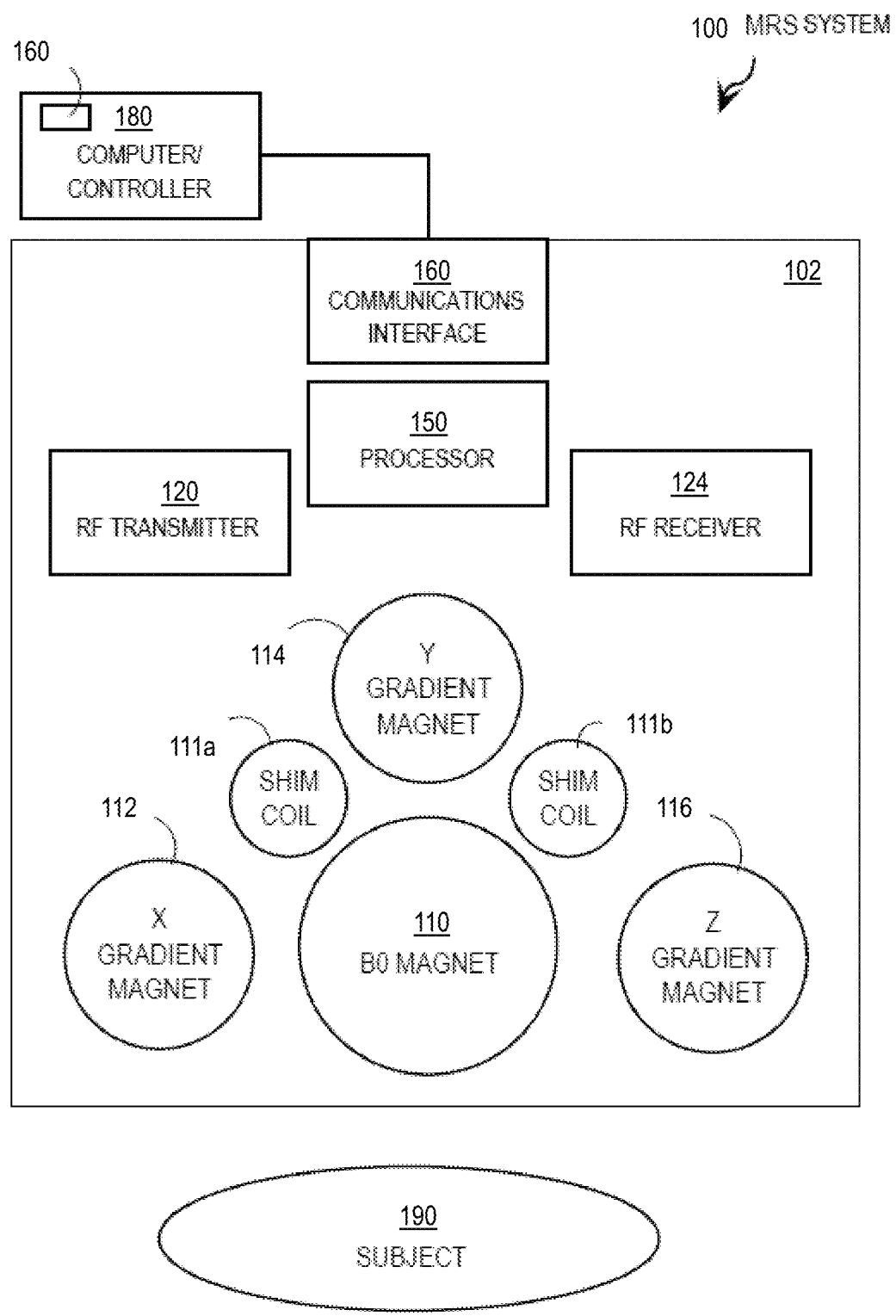
FIG. 1 is a block diagram that illustrates an example MRS system, according to an embodiment.

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements at the time of this writing. Furthermore, unless otherwise clear from the context, a numerical value presented herein has an implied precision given by the least significant digit. Thus, a value 1.1 implies a value from 1.05 to 1.15. The term "about" is used to indicate a broader range centered on the given value, and unless otherwise clear from the context implies a broader range around the least significant digit, such as "about 1.1" implies a range from 1.0 to 1.2. If the least significant digit is unclear, then the term "about" implies a factor of two, e.g., "about X" implies a value in the range from 0.5X to 2X, for example, about 100 implies a value in a range from 50 to 200. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

Some embodiments of the invention are described below in the context of Hydrogen nuclei (protons) with a spin of 1/2 in medical MRS. However, the invention is not limited to this context. In other embodiments, other nuclei with non-zero spin in the living or non-living subjects use the techniques described herein, including but not limited to: carbon-13 ($^{13}C$) and phosphorus-31 ($^{31}P$) and other biologically relevant nuclei with higher spin quantum numbers such as sodium-23 ($^{23}Na$, spin 3/2) and oxygen-17 ($^{17}O$, spin 5/2). In other embodiments, heteronuclear coherence pathway selection and crushing is provided for coupled nuclear spins from different elements, including but not limited to $^{1}H$-$^{13}C$ in proton observed carbon edited (POCE) and $^{1}H$-$^{31}P$ in proton observed phosphorus edited (POPE) MRS. In addition, this technique may be useful for MRI sequences which employ large numbers of RF pulses, such as quantitative $T_2$ imaging or fast 3D imaging (which both utilize trains of 8 or more refocusing pulses), where similar unwanted coherence pathways can manifest themselves in the acquired signal.

Signal from unwanted pathways can be problematic for a variety of reasons. Firstly, some of the unwanted pathways originate from outside the voxel which can cause erroneous estimates of concentrations within the region of interest, as well as increasing the likelihood of lipid contamination. Secondly, different pathways rephase at a different time point, thus their summation can result in signal cancellation and a disruption of the Lorentzian nature of the absorption spectrum, potentially causing erroneous quantification. Thirdly, for spectral editing subtraction sequences, such as MEGA, the signal is measured twice and subtracted, once with the editing pulses centered on a metabolite-of-interest's coupling partner (referred to as the "on" condition), and once where the editing pulses do not affect the metabolite-of-interest (referred to as the "off" condition). If there are unwanted pathways which are not consistent between the two cycles (either due to spurious motion or a change in the pathways due to the change in the offset of the editing pulses), then the pathways could be present in the difference signal and potentially contaminate the concentration estimate of the metabolite of interest. Furthermore, each pathway has its own unique $T_1$-, $T_2$- and diffusion-weighting, thus for quantitative experiments interested in probing these the $T_1$ and $T_2$ values distortions may be introduced from unwanted coherence pathways.

Although phase cycling schemes can assist in the suppression of unwanted echoes, spurious motion, which is unavoidable in vivo, can reduce its efficacy. Additionally, the more modern sequences, such as localization by adiabatic selective refocusing (LASER) and semi-localization by adiabatic selective refocusing (sLASER), typically do not employ phase-cycling schemes sufficient to remove all unwanted coherence pathways due to the increased number of cycles required. With sequences such as sLASER and LASER which employ adiabatic full-passage pulses (AFP) there is increased transition sharpness as well as reduced refocusing outside the pass band (due to their non-linear phase profile) which reduces the likelihood of unwanted coherence pathway contamination, however since there are also conversely more pulses and thus a larger number of unwanted coherence pathways, these unwanted coherence pathways can still be present in the measured spectrum. It is therefore advisable to use a gradient crusher scheme which dephases all unwanted pathways in conjunction with, if available, phase cycling.

A common strategy for designing a crusher scheme for a particular pulse sequence is to adjust crusher position and area by trial and error, often manually input for an experimental phantom, until the obtained spectrum appears free from the typical unwanted pathway characteristics. This procedure works well for sequences such as PRESS and stimulated echo acquisition mode (STEAM) which have only three pulses and 3 crushers (on each of the three orthogonal gradient axes) and a total of 9 possible coherence pathways for an uncoupled spin, 8 of which must be crushed, but does not guarantee that more subtle effects have been eliminated. This trial-and-error strategy becomes a much less effective when two coupled spins are considered for a sequence such as MEGA-LASER, which contains 9 RF pulses, resulting in 390,625 possible pathways which can generate signal, all of which except for one must be crushed from the combination of 9 gradients on the three orthogonal axes. To the best of the authors' knowledge there is no rigorous general treatment of echo pathways for in vivo MRS sequences beyond those done for MEGA and LASER. Thus. for many pulse sequences, there can be found examples in the literature which do not crush all unwanted echo pathways. For an uncoupled spin ½ particle, ignoring the crushing effects of the slice-select gradients and pulse profiles, it can be shown that: the crusher scheme for PRESS used by Landheer et al. does not crush the unwanted stimulated-echo component; a scheme for SLASER by Scheenen et al. does not suppress 26 unwanted pathways; another scheme for SLASER by Klomp et al. does not suppress 2 unwanted pathways; a scheme for MEGA-SLASER by Andreychenko et al. does not suppress 8 unwanted pathways; a separate scheme for MEGA-SLASER by Prinsen et al. does not suppress the same 8 unwanted pathways; a scheme for MEGA-LASER by Bogner et al. does not suppress 2 unwanted pathways; and, a scheme by Lin et al. for J-resolved LASER and J-resolved SLASER does not suppress 29 and 4 unwanted pathways, respectively. Considering potential multiple-quantum coherence order pathways, which may be possible for J-coupled nuclei of interest, the number of unsuppressed coherence pathways increases substantially.

Furthermore, even for schemes that do suppress all unwanted echoes they are unlikely to use the available crushing strength in an optimal manner, thus requiring the crushers to be of longer duration (increasing the minimum allowable echo time, TE) or of higher amplitude (exacerbating eddy current effects and potentially inducing vibromechanical motion) than is desirable.

The effect of unwanted signal pathways have been studied in depth for PRESS and although the minimum crushing power to sufficiently suppress unwanted pathways is investigated no general strategy for modification of the actual crusher scheme is developed. The problem of unwanted coherence pathways has been well-developed in the NMR world, and an algorithm has previously been developed to prescribe the optimal crusher scheme for proper coherence pathway selection assuming the signal originates from a cylindrical volume. This algorithm is unsuitable for in vivo sequences because no assumption about the spatial localization of the unwanted coherence pathways can be made.

1. OVERVIEW

In some embodiments, one or more steps of the method described below are incorporated into an MRS scanning system or apparatus. FIG. 1 is a block diagram that illustrates an example MRS system 100, according to an embodiment. The system 100 includes a scanning apparatus 102 and a computer/controller 180. Although a subject 190 for MRS scanning is depicted in FIG. 1, subject 190 is not part of the MRS system 100.

The scanning apparatus 102 includes a B0 magnet 110, an x-gradient magnet 112, a y-gradient magnet 114, a z-gradient magnet 116, a group of shim coils (e.g., shim coils 111a and 111b), a radio frequency (RF) transmitter 120, an RF receiver 124, a communications interface 140, and a processor 150. As depicted, the components of scanner 102 are standard and well known in the art.

The computer/controller 180 sends signals to the communications interface 140 in scanner 102 that causes the scanner to operate the gradient magnets 112, 114 and 116 and the RF transmitter 120 and RF receiver 124 to obtain MRS data.

In the illustrated embodiment, computer/controller 180 includes module 160 to improve crushing of unwanted coherence pathways. Process 160 performs one or more steps of the method described below with reference to FIG.

4. The collected data is received at computer/controller 180 or another computer and used to determine the measured MRS spectra.

In some embodiments, module 160 is included in processor 150 within scanner 102. In various embodiments, one or more steps of the method are performed by multiple processors on scanner 102 or computer/controller 180 or other computers connected to computer/controller 180 via a network.

Although processes, equipment, and data structures are depicted in FIG. 1 as integral blocks in a particular arrangement for purposes of illustration, in other embodiments one or more processes or data structures, or portions thereof, are arranged in a different manner, on the same or different hosts, in one or more databases, or are omitted, or one or more different processes or data structures are included on the same or different hosts.

Figure 2A:
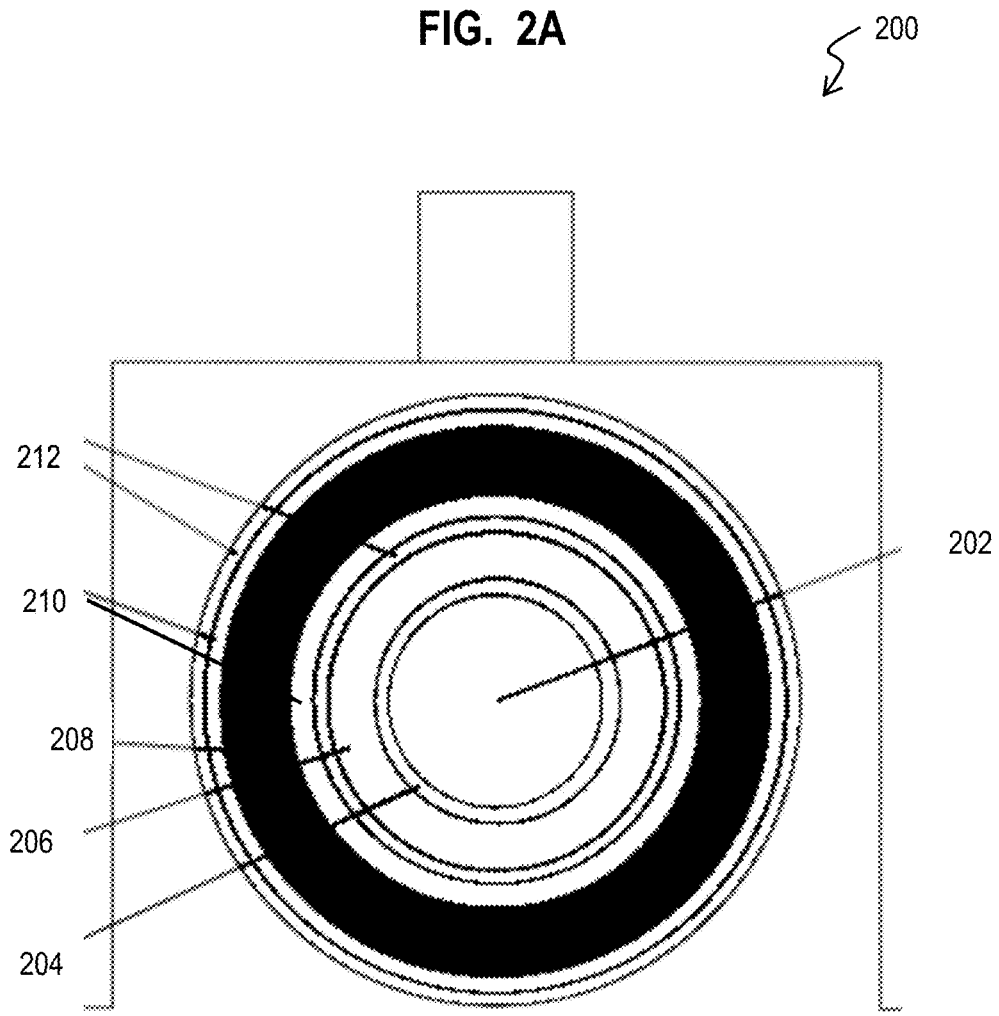
FIG. 2A is a block diagram that illustrates an example cross section of a MRS system in a x-y plane perpendicular to the direction z of the magnetic field B0, upon which an embodiment may be implemented.

FIG. 2A is a block diagram that illustrates an example cross section of a MRS system 200 in a x-y plane perpendicular to the direction z of the magnetic field B0, upon which an embodiment may be implemented. The system 200 is roughly cylindrical with the z-direction field B0 oriented along the rotational axis of symmetry for the cylinder. The scanner bore 202 is a cylindrical space into which a subject is inserted. Successively outward layers include RF transmit coil 204, the magnetic gradient coils 206, a superconducting primary electromagnetic coil 208 to provide the B0 field between two cooling layers 210, e.g., filled with liquid helium, to cool the primary magnet to superconducting temperatures, and thermal insulation layers 212.

Figure 2B:
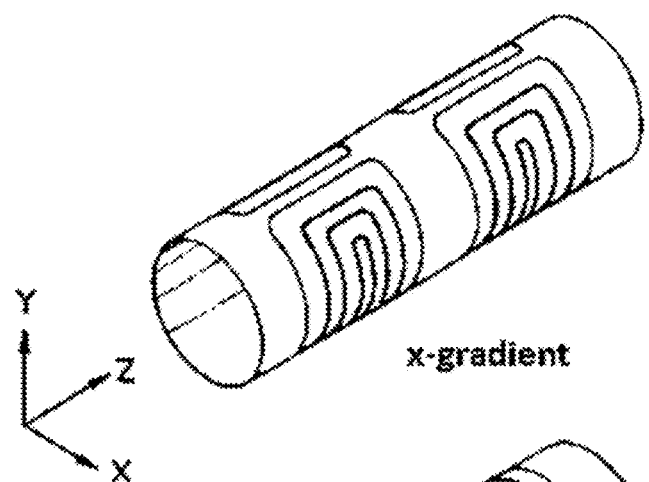
FIG. 2B through FIG. 2D, are block diagrams that illustrate example coils distributed around the bore hole of FIG. 2A, which can serve as x-gradient, y-gradient and z gradient coils in the z-directed magnetic field to crush unwanted coherence pathways, according to an embodiment.
Figure 2C:
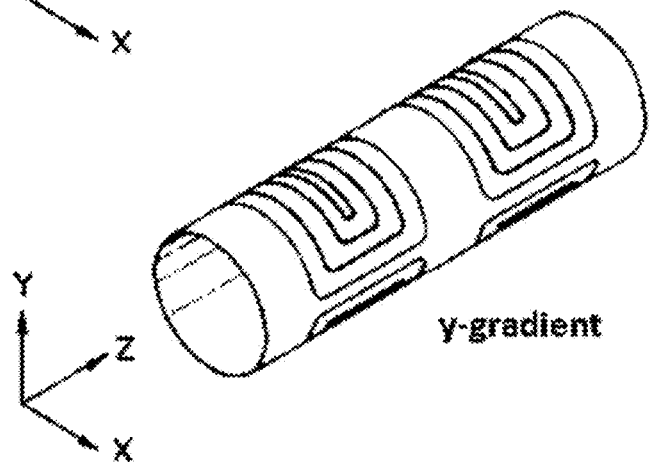
Figure 2D:
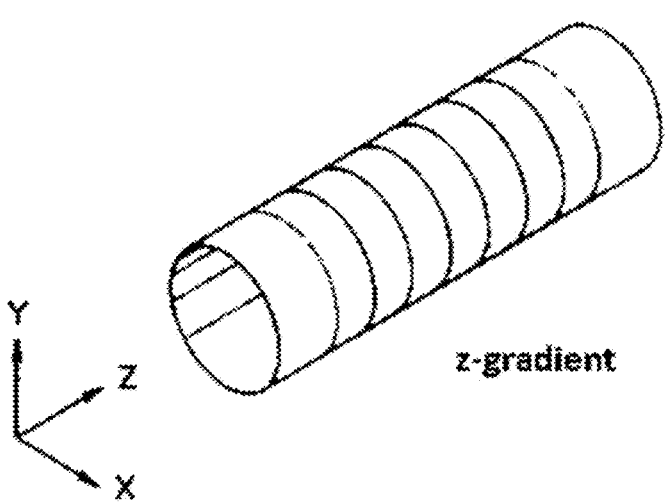

FIG. 2B through FIG. 2C, are block diagrams that illustrate example coils distributed around the bore hole of FIG. 2A, which can serve as x-gradient, y-gradient and z gradient coils in the z-directed magnetic field to crush unwanted coherence pathways, according to an embodiment. These coils occupy layer 206 in FIG. 2A. These coils are operated to determine the spatial distribution of the MRS measurements during imaging; and, as shown below, are operated at high gradient strengths in time intervals between RF pulses to crush unwanted coherence pathways.

FIG. 3 is a coherence order pathway diagram that illustrates example time series of RF pulses, crusher pulses and a target coherence pathway, for which crusher pulses are determined according to an embodiment. Each time series is indicated by a horizontal trace displaced from other traces vertically. The horizontal distance indicates time in arbitrary units, but such time series are typically executed over times from several to hundreds of milliseconds. The RF trace 310 shows three pulses of relatively short duration. The height of each pulse indicates amplitude in arbitrary units. Each RF pulse imparts a phase change that changes the coherence order of the precessing nuclei. The desired or target coherence order p over time is given by the third trace 330 in which the vertical axis indicates phase order between −2 and +2. As can be seen, the coherence order is changed during each RF pulse. The trace 330 is called the coherence pathway and is only the one target pathway, excluding many possible pathways excited in coupled nuclei by these same RF pulses.

To crush unwanted coherence orders that by definition are not on the desired, target coherence pathway, crusher pulses implemented on one or more gradient coils are introduced between RF pulses. Example crusher pulses (e.g., Gx) are shown in the middle trace 320 labeled g. Each pulse may be of independent strength indicated by the vertical distance in arbitrary units and independent duration indicated by the widths and labeled $\tau_1$ through $\tau_4$, the latter three following each RF pulse. The grey area inside each pulse is the gradient pulse area (the time-integral of the gradient waveform).

After all RF and gradient pulses have completed, the FID is measured, indicated schematically by the decaying oscillation 340.

It is noted here that current schemes for crushing unwanted coherence pathways are not complete; and techniques described next have been newly developed to design crusher pulses (g) that more completely crush the unwanted coherence pathways.

Figure 4:
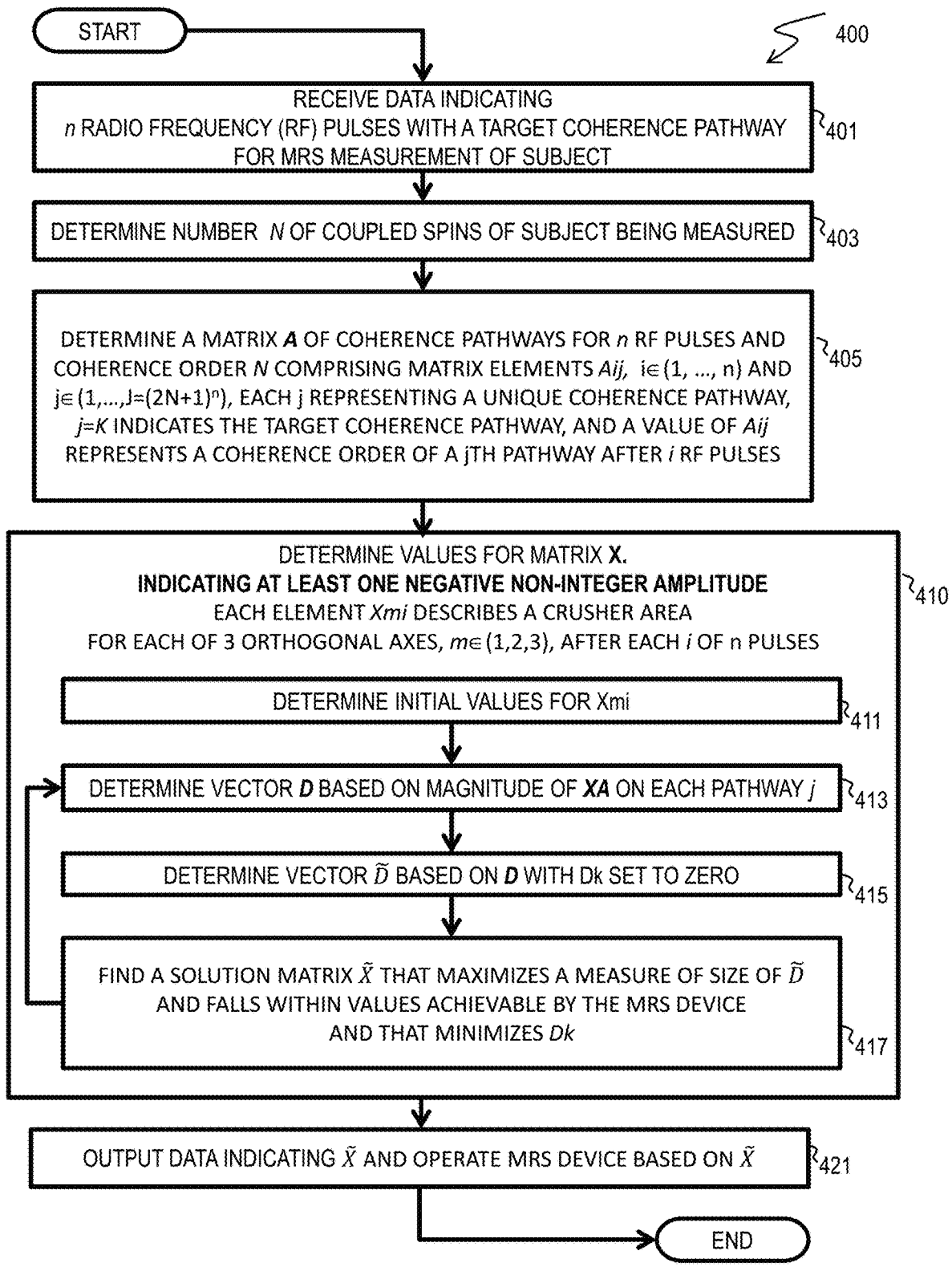
FIG. 4 is a flow diagram that illustrates an example method for determining crusher pulses to crush unwanted coherence pathways, according to an embodiment.

FIG. 4 is a flow diagram that illustrates an example method for determining crusher pulses to crush unwanted coherence pathways, according to an embodiment. Although steps are depicted in FIG. 4 as integral steps in a particular order for purposes of illustration, in other embodiments, one or more steps, or portions thereof, are performed in a different order, or overlapping in time, in series or in parallel, or are omitted, or one or more additional steps are added, or the method is changed in some combination of ways.

In step 401, first data is received. The first data indicates a sequence of n radio frequency (RF) pulses with a target coherence pathway for making a magnetic resonance spectroscopy (MRS) measurement using a MRS device of a subject that has at least N coupled spins of interest. In various designs, the number n of pulses varies, but is typically in a range from about 3 to about 9. Any method may be used to receive the first data, such as retrieving the first data from local or remote data storage, either unsolicited or in response to a query. Depending on the subject and material to be measured, the number N of coupled spins varies, but is typically in a range from about 1 to about 4 for Hydrogen nuclei. In step 403 the number N of coupled spins is determined, N≥1. For example, N is fixed at 4 or is in data received as input or retrieved from local or remote data storage, either unsolicited or in response to a query.

In step 405, a matrix A is determined. The matrix A describes coherence pathways for n RF pulses and coherence order N and is made up of matrix elements Aij, i∈(1, . . . , n) and j∈(1, . . . , J=(2N+1)$^n$), each j representing a unique coherence pathway. A particular pathway or set of pathways, j=K, indicates the target coherence pathway(s). In some embodiments K represents a set of desired pathways, e.g., k1, k2 etc. A value of Aij represents a coherence order of a jth pathway after i RF pulses. An example matrix A is given here by Equations 4a $$A_{i,j} = \rho_{1+floor\left(\frac{j-1}{(2N+1)^{n-i}}\right) \% (2N+1)}; \quad (4a)$$

where ρ is a vector of possible coherence orders for N coupled nuclei, given by expression 4b $$\rho=[-N,-N+1,\ldots,N-1,N]. \quad (4b)$$

and % indicates the modulus operation, and floor indicates the largest included integer.

In step 410, values for elements Xmi of a matrix X are determined. Each element Xmi describes a crusher area for each of 3 orthogonal axes, m∈(1,2,3), after each pulse i of n pulses. The crusher area is a product of a spatial gradient Gmi along axis m of an ith crusher pulse and a duration time τmi of the ith crusher pulse. Of all possible crusher areas, the ones of interest are those that are improved as follows, and ideally optimized. The matrix X with optimized values is termed matrix $\tilde{X}$. Step 410 includes steps 411 through 417.

As described in more detail below, in various embodiments, a value of Gmi is a negative, non-integer for at least one value of m and at least one value of i, which is in contrast to crusher amplitudes used in previous approaches.

In step 411, X is initialized with initial values. Any method may be used to select initial values, including setting all elements to 1, or randomly selecting between 1 and 0 for any element, or randomly selecting values in a range up to a product given by a maximum physically possible gradient amplitude times a longest crusher duration that fits between the RF pulses.

In step 413, the dephasing on each pathway is estimated. The phase accumulated by a particular spin with coherence order p by the application of a crusher pulse having amplitude vector G, during a period without the application of an RF pulse, is given by Equation 5a.

$$\varphi = \gamma p r \cdot \int_0^\tau G(t) dt \qquad (5a)$$

Where $\gamma$ is the gyromagnetic ratio, r is a vector representing a displacement from the isocenter, G, as stated above, is a vector representing the applied gradient amplitude, and $\tau$ is the duration of the gradient amplitude. Because the phase accumulated by the crusher is linearly proportional to the coherence order p, the matrix A above can be constructed. In an illustrated embodiment, the dephasing is estimated by computing the elements of vector D (1 by J) based on the matrices X (3 by n) and A (n by J). The elements Dj have values that indicate a magnitude of a matrix product of XA for each coherence pathway. In an example embodiment, D is computed as given by Equation 5b.

$$D = \sqrt{(AX)^t \cdot (XA)^t}, \qquad (5b)$$

Note the product of $(XA)^t$ is a J by 3 matrix and the scalar dot product of two J by 3 matrices is a 1 by J column vector.

In step 415, a vector $\tilde{D}$ is determined based on D with element $D_K$ constrained to a value at or near zero, recall element $D_K$ is the size of the dephasing of the target coherence pathway. The concept is to maximize the dephasing of the unwanted coherence pathways that are represented by the vector $\tilde{D}$.

In step 417 the values of X are modified to find a solution $\tilde{X}$ that maximizes a measure of the size of $\tilde{D}$. Any metric that is related to the size of a vector can be used in various embodiments, such as: the sum of the elements of $\tilde{D}$, the sum of the squares of the elements of $\tilde{D}$, the average of the elements of $\tilde{D}$, the largest element of $\tilde{D}$, the smallest element of $\tilde{D}$, the median sized element of $\tilde{D}$, among others, alone or in some combination. In an example embodiment, the size of $\tilde{D}$ is determined as a sum of the minimum element of $\tilde{D}$ and the mean value of the elements of $\tilde{D}$. A solution based on this size metric is expressed by Equation 6.

$$\hat{X} = \underset{X}{\operatorname{argmax}} (\min(\tilde{D}) + \alpha \ \operatorname{mean}(\tilde{D})), \qquad (6)$$

Where $\alpha$ is a parameter than can be tuned by experiment to determine the relative contribution of the mean to the metric of the size of $\tilde{D}$. In example embodiments, the value of $\alpha$ is in a range from 0 (no weighting to the mean of $\tilde{D}$) to a large number (no weighting to the min of $\tilde{D}$), such as 1000. A typical value of $\alpha$ is 1.00.

At the same time as modifying the elements of X to maximize the size of $\tilde{D}$, at least two other constrains are advantageously enforced. One constraint is that the resulting gradient areas must be those that can be executed by the MRS device at hand. This constraint is often determined by providing an upper and lower limit for the area of the gradient that can be provided by each of the three orthogonal gradient coils of a particular MRS device. These inform the upper and lower limits expressed in the examples below. In such embodiments, the upper and lower limits for each gradient direction are provided with the first data in step 401.

The second constraint is that the target pathway(s) not be crushed. One way to express this is that the value of $D_K$ is constrained to be zero or some other small value, e.g., to minimize the value of an absolute value of $D_K$. In the example embodiments, this constraint is given by Equation 7.

$$\Sigma_{i=1}^n \hat{X}_{j,i} A_{i,s} = 0, j \in \{1,2,3\}; \qquad (7)$$

Finding the solution $\tilde{X}$ for X is often done by randomly changing each element of X and repeating steps 413 and 415 and determining in step 417 if the size of each element got larger or smaller. That informs the change in X for the next try. Various methods are available and widely known to optimize the values of a matrix like X to maximize a benefit function, like $\tilde{D}$. In example embodiments, the solution is obtained using the active set method as implemented in MATLAB™ from MATHWORKS™ of Natick Massachusetts, using a random set of initial crushers and repeated with different initial crusher sets 10,000 times in order to obtain as close to the global maximum as feasible.

In step 421, output data that indicate the solution is produced and, in some embodiments, the MRS device is operated using the solution to form the crushing pulses. The crusher areas indicated in matrix $\tilde{X}$ are implemented as gradient magnet amplitudes Gmi, for each of three gradient directions (m=1,3), for crusher pulse durations that fit within the time gaps between successive RF pulses. All crusher pulse durations $\tau i$ can be the same; but, in some embodiments one or more duration is different. The associated gradient magnet amplitudes Gmi in general involve at least one negative, non-integer amplitude, as shown in the examples below. The process then ends.

2. EXAMPLE EMBODIMENTS

Example embodiments are described for replacing crusher parameters for 7 modern MRS sequences (STEAM, PRESS, MEGA-PRESS, sLASER, MEGA-sLASER, LASER and MEGA-LASER).

Figure 5A:
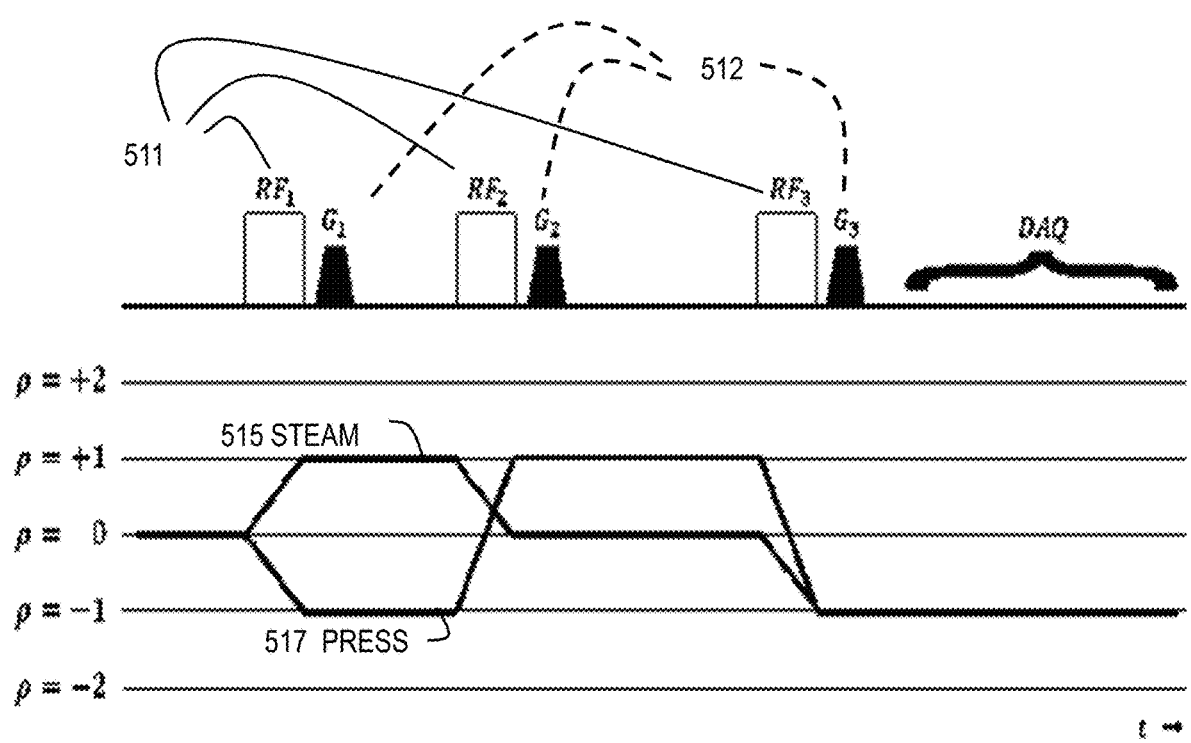
FIG. 5A through FIG. 5C are coherence order pathway diagrams that illustrate example RF pulses and target coherence pathways to be more effectively achieved, according to various embodiments.
Figure 5B:
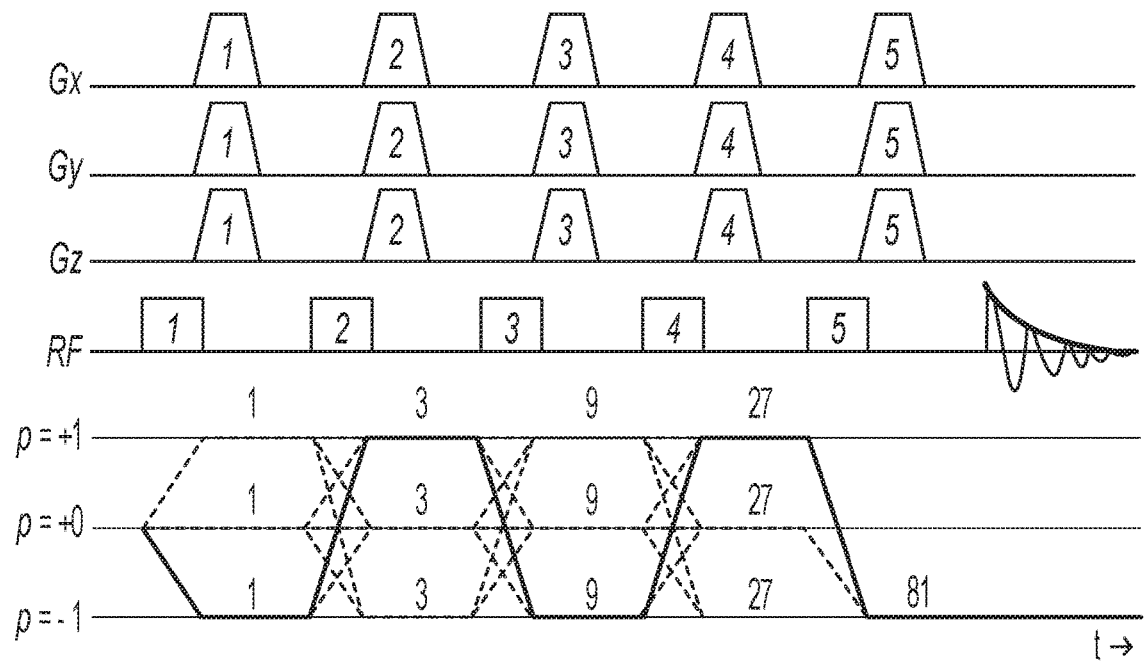
Figure 5C:
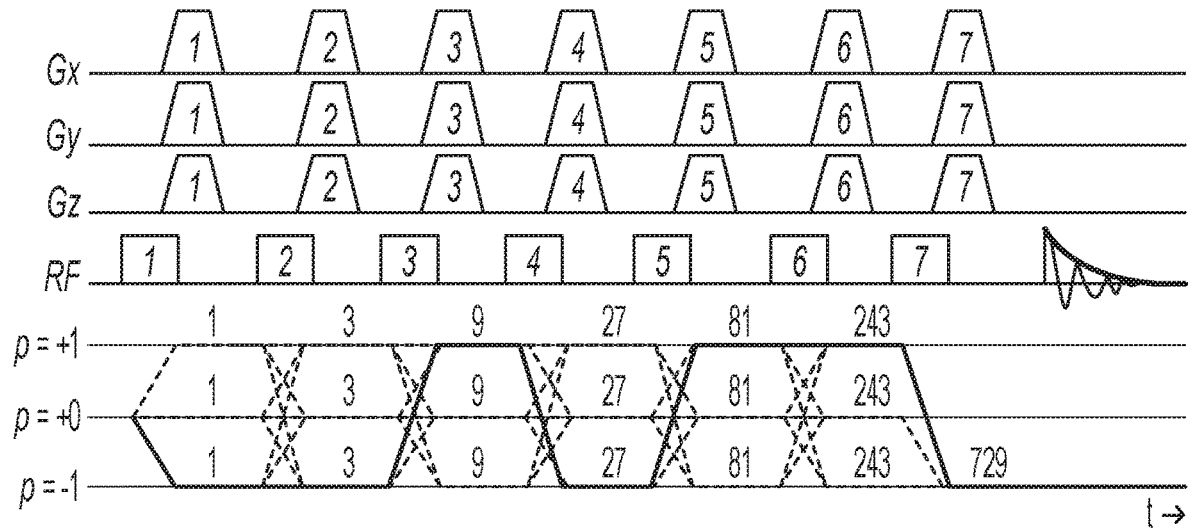

Typically, only a single coherence pathway is of interest in an MRS experiment, as shown in FIG. 5A through FIG. 5C. FIG. 5A through FIG. 5C are coherence order pathway diagrams that illustrate example RF pulses and target coherence pathways to be more effectively achieved, according to various embodiments. FIG. 5A through FIG. 5C represent pulse sequence and coherence pathway diagrams employing 3, 5 and 7 RF pulses, respectively. FIG. 5A is a conceptual depiction of the coherence pathway diagram for three RF pulses (n=3). Note that in general the three gradients are played out in three directions (x, y, and z) but here, for simplicity, the crusher gradient pulses (crusher pulses) are shown for only one direction. Trace 515 depicts the target coherence pathway for STEAM; and, trace 517 depicts the target coherence pathway for PRESS. Both target pathways have a coherence order of 0 prior to the first RF pulse, and have a coherence order of −1 after the third RF pulse, as this is the only coherence order measured by a quadrature detection coil. DAQ indicates data acquisition interval of the FID signal. The phase accrued by a spin for a period of free precession, even in the presence of a gradient field, is given by Equation 5a, above. Thus the total phase for the actual coherence pathways is obtained by successively summing Equation 5a for all free-precession periods.

FIG. 5B is an example coherence pathway diagram for five RF pulses (n=5) with a maximum coherence order (N) of 1 (3 possible coherence orders, −1, 0, +1). RF pulses induce transitions between the coherence order, and the coherence order history prior to detection represents the coherence pathway. The target coherence pathway for sLASER is shown as a solid trace, all other coherence pathways are depicted as dashed traces. In general, there is substantial overlap at each step in the coherence pathway, thus the total number of distinct but overlapping pathways are indicated, increasing by a factor of 3 at each pulse from 1 to 3 to 9 to 27 to 81. A properly designed crusher scheme sufficiently de-phases all unwanted coherence pathways while leaving the target coherence pathway(s) unaffected.

FIG. 5C is an example coherence pathway diagram for seven RF pulses (n=7) with a maximum coherence order (N) of 1. The desired coherence pathway for MEGA-sLASER is shown as a solid trace, all other coherence pathways are shown as dashed traces. The number of overlapping individual coherence pathways after each pulse is indicated. The total number of distinct but overlapping pathways are indicated, increasing by a factor of 3 at each pulse from 1 to 3 to 9 to 27 to 81 to 243 to 729.

In general, the number of measured coherence pathways with maximum coherence order of 1, having 3 states ($\rho$=−1, 0, +1), can be expressed by, $3^{n-1}$, where n is the number of RF pulses. The number of unwanted coherences is therefore largely increased for modern sequences such as LASER, sLASER or MEGA-sLASER over n=3 experiments; and, the challenge of designing an appropriate crusher scheme becomes substantially more difficult. There can be found examples in the literature of MRS sequences which do not crush all unwanted pathways. To name a few, the crusher schemes used by Landheer, Scheenen, Prinsen, and Andreychenko do not crush 1, 26, 8 or 8 of the 8, 242, 728 or 728 unwanted coherence pathways, respectively.

In the following example embodiments, all experiments were performed on a MR750 3T MRI system (GE Healthcare, Wis., USA) with a standard eight-channel head coil receiver. The sequences for sLASER and MEGA-sLASER were implemented in-house using custom hyperbolic secant 4 pulses (HS4), with durations of 5 ms and bandwidths of 5048 Hz. The editing pulses for MEGA-SLASER were Gaussians were 10% cutoff and a duration of 10.24 ms placed at 4.51 ppm, as this is the common placement for sequences targeting glutathione. The echo times used for SLASER for all experiments were 40 ms (minimum allowable echo time to accommodate sufficient crushing power), and 72 ms for MEGA-SLASER. Experiments were performed on a GE BRAINO phantom with receiver bandwidth of 2500 Hz, 2048 acquired points, TR of 1500 ms, 128 excitations and a voxel size of 20×20×20 cubic millimeters. All spectra displayed had residual water removed Hankel singular value decomposition and no applied line broadening.

The effect of crusher schemes from the literature and the currently disclosed improved crusher schemes on the MRS spectral appearance were investigated. First, the schemes for sLASER and MEGA-sLASER obtained from Scheenen and Andreychenko, respectively, were compared to the crusher schemes according to some embodiments. The experimental values for the crusher duration and amplitude are shown in the Table 1 of FIG. 6. FIG. 6 is a table (Table 1) that illustrates example crusher amplitudes and durations for two well-known RF pulse sequences, according to various embodiments. Table 1 lists crusher duration and amplitude for sLASER (n=5) and MEGA-sLASER (n=7) experiments shown in FIGS. 3 and 4, respectively, for both the previous crusher scheme in the literature and for the improved crusher scheme of experimental embodiments (the latter labeled "novel crusher scheme" in Table 1). On each row, the crusher number column indicates the RF pulse number i∈(1, n) that the crusher follows.

A block of rows indicates one scheme. For example, the first block, having 5 rows, corresponds to the Scheenen crusher scheme from the literature for sLASER pulses; the second block, also having 5 rows, corresponds to the novel crusher scheme for sLASER pulses according to one embodiment using the same crusher duration as the literature; the third block, having 7 rows, corresponds to the Andreychenko crusher scheme from the literature for MEGA-sLASER pulses; the fourth block, also having 7 rows, corresponds to the novel crusher scheme for MEGA-sLASER pulses according to one embodiment using the same crusher duration as the literature; and, the fifth block, also having 7 rows, corresponds to the novel crusher scheme for MEGA-sLASER pulses according to another embodiment not constrained to using the same crusher duration as the literature.

For each row, the durations $\tau i$ (in milliseconds, ms) of crushers along all three of the individual orientation axes have been set to be equal and are listed in the crusher duration column. The gradient coil amplitude Gmi is given for each direction (m=1, 2, 3 for x, y, z, respectively), where i is the crusher number for the row, in the three columns labeled crusher amplitude x, crusher amplitude y and crusher amplitude z, respectively. The units of crusher amplitude are milliTesla per meter (mT/m). Note that in Table 1, for the novel crusher schemes, the crusher amplitude Gmi is equal to the solution matrix element for mi (Xmi) divided by the duration ($\tau i$).

It is evident from Table 1 that the amplitudes, Gmi, for the literature crusher schemes (first and third blocks of rows) are always positive integers. In contrast, the amplitudes for each novel crusher scheme (each block of the second, fourth and fifth blocks of rows) includes positive integer and non-integer amplitudes—as well as at least one negative, non-integer amplitude, e.g., −12.07, −22.5, and −20.56, respectively. As will be seen, the preferred embodiment for MEGA-sLASER crushers is the fifth block that is not constrained to use equal crusher durations. In the preferred embodiments, the negative, non-integer amplitude (−12.07 and −20.56, respectively) is also not a negative integer multiple of ½. While it is always possible to multiply all amplitudes by −1 and get the same crushing effects, the mix of positive and negative, integer and non-integer amplitudes is not employed in the literature.

Figure 7:
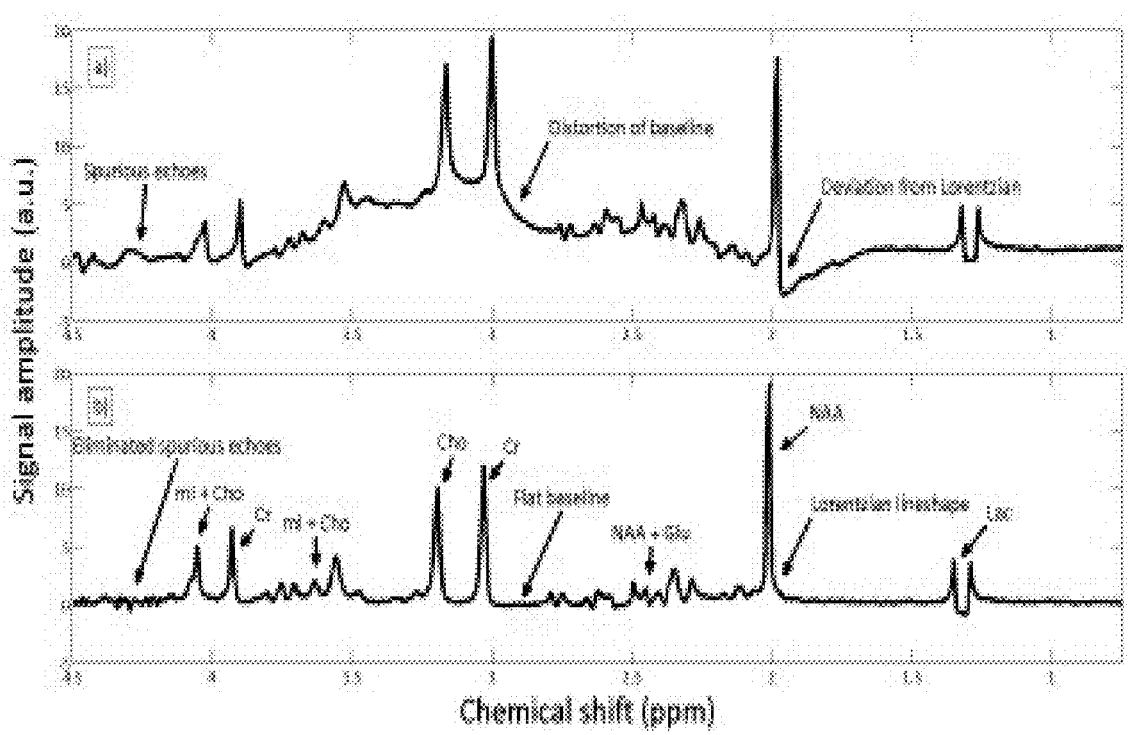
FIG. 7 depicts a pair plots that illustrate example MRS measured spectra before and after implementing improved crushing of non-target coherence pathways; according to various embodiments.

FIG. 7 depicts a pair plots that illustrate example MRS measured spectra before and after implementing improved crushing of non-target coherence pathways; according to various embodiments. Each plot depicts sLASER MRS spectra from BRAINO phantom with TE=40 ms. The top plot uses the literature crusher scheme obtained from Scheenen, with amplitudes and durations given by the first block of rows in Table 1. The bottom plot uses the novel crusher scheme from the developed algorithm with crushers that have equal maximum amplitude and duration, according to an embodiment, with amplitudes and durations given by the second block of rows in Table 1. As can be seen, spurious echoes in the top plot substantially distort the baseline and quality of the spectra. The distortions are drastically reduced in the bottom plot by only modifying the crusher scheme without changing the individual crusher duration or maximum amplitude.

Figure 8:
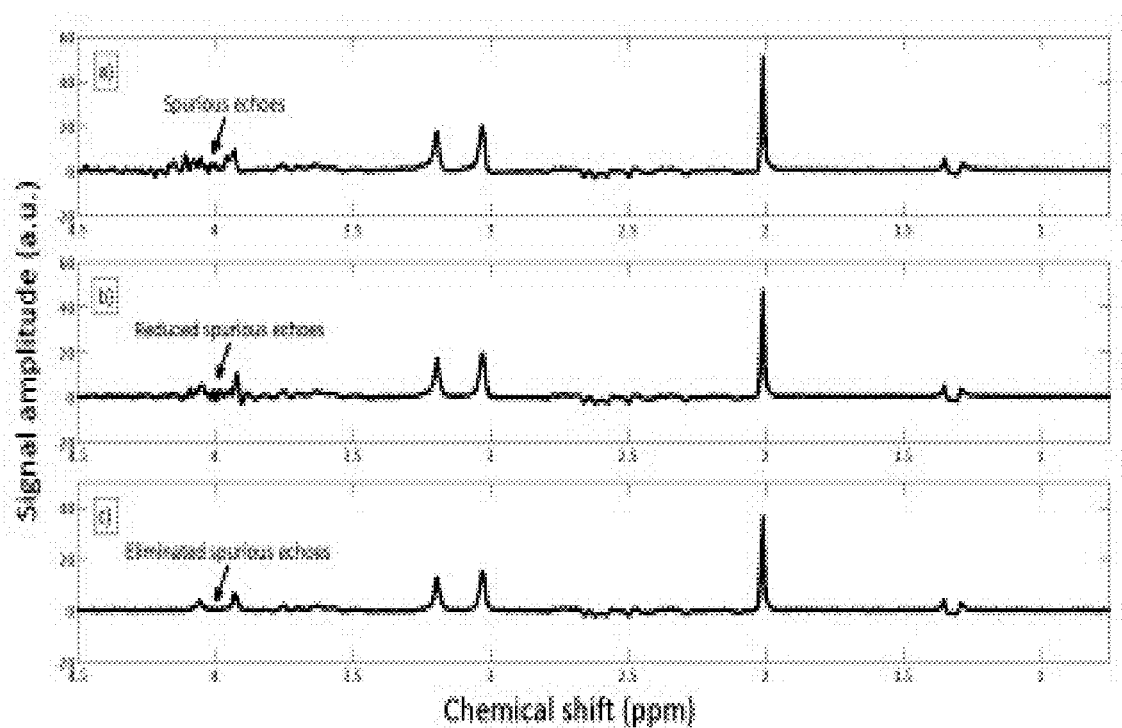
FIG. 8 is a set of plots that illustrate example MRS measured spectra before and after implementing improved crushing of non-target coherence pathways; according to various embodiments.

FIG. 8 is a set of plots that illustrate example MRS measured spectra before and after implementing improved crushing of non-target coherence pathways; according to various embodiments. Each plot depicts MEGA-sLASER spectra from BRAINO phantom with TE=72 ms. The top plot uses the crusher scheme obtained from Andreychenko, with amplitudes and durations listed in the third block of rows in Table 1. The middle plot uses a crusher scheme with crushers that have equal maximum amplitude and duration, according of an embodiment, with amplitudes and durations listed in the fourth block of rows in Table 1. The bottom plot uses a crusher scheme with crusher durations matched to the time between successive RF pulses, according to an embodiment, with amplitudes and durations listed in the fifth block of rows in Table 1. As can be seen, the spurious echoes can be reduced by only modifying the crusher scheme; and, can be completely eliminated by matching the duration of the crusher pulses to the time gap between RF pulses. Although this reduction in distortion is useful, it is noted that there is also a reduction in signal amplitude for the various embodiments due to the increased diffusion weighting. This effect is particularly prominent because the phantom has diffusivities approximately 2 to 4 times greater than human tissue, making the issue less severe in in vivo experiments.

The optimization algorithm was run for seven of the most common in vivo MRS sequences: STEAM, PRESS, MEGA-PRESS, SLASER, MEGA-SLASER, LASER and MEGA-LASER and the results are displayed in Table 2. In Table 2, the gradient coil amplitudes for the crusher pulses are not listed explicitly. Instead, the area, equal to a time integral of amplitude and duration time, is presented relative to reference value. The reference value depends on the particular hardware. The point is that all of the values listed in Table 2 would be the factor by which the physical hardware gradients have their maximum amplitude multiplied.

TABLE 2

Optimized relative areas

| Pulse sequence | Minimum crushing strength (unitless) | Crusher number | Relative crusher area, (unitless), axis 1 | Relative crusher area (unitless), axis 2 | Relative crusher area (unitless), axis 3 |
| --- | --- | --- | --- | --- | --- |
| STEAM | $\sqrt{3}$ | 1 | 1 | 2 | 1 |
| | | 2 | 1 | 2 | 1 |
| | | 3 | 1 | 0 | 1 |
| PRESS | $\sqrt{3}$ | 1 | 1 | 2 | 1 |
| | | 2 | 1 | 2 | 1 |
| | | 3 | −1 | 0 | 1 |
| MEGA-PRESS | 1.01 | 1 | 1 | −1 | 1 |
| | | 2 | 1 | −0.02 | 0.54 |
| | | 3 | −0.90 | −1 | 0.92 |
| | | 4 | −0.79 | 0.86 | 1.00 |
| | | 5 | −0.11 | −0.88 | −0.54 |
| SLASER | 1.01 | 1 | 1 | 0.99 | −1 |
| | | 2 | −1 | 0.92 | −1 |
| | | 3 | −1 | −0.09 | −0.5 |
| | | 4 | 0.87 | −1 | −1 |
| | | 5 | −0.13 | −0.98 | −0.50 |
| MEGA-SLASER | 0.50 | 1 | −0.78 | −0.70 | −0.68 |
| | | 2 | −0.62 | 1.00 | 0.99 |
| | | 3 | −0.91 | 0.06 | 0.99 |
| | | 4 | 1.00 | 0.94 | −0.53 |
| | | 5 | −1.00 | 1.00 | −1.00 |

TABLE 2-continued

Optimized relative areas

| Pulse sequence | Minimum crushing strength (unitless) | Crusher number | Relative crusher area, (unitless), axis 1 | Relative crusher area (unitless), axis 2 | Relative crusher area (unitless), axis 3 |
| --- | --- | --- | --- | --- | --- |
| | | 6 | 0.79 | 1.00 | −0.07 |
| | | 7 | −0.72 | 0.82 | 0.14 |
| LASER | 0.50 | 1 | 1.00 | 0.99 | 0.14 |
| | | 2 | 0.99 | 0.80 | 0.85 |
| | | 3 | −1.00 | 1.00 | 0.91 |
| | | 4 | 0.14 | 0.78 | −1.00 |
| | | 5 | −0.49 | −0.30 | −0.77 |
| | | 6 | −0.65 | 0.99 | −0.56 |
| | | 7 | 0.97 | 0.88 | −0.99 |
| MEGA-LASER | 0.21 | 1 | −0.01 | −0.89 | 1.00 |
| | | 2 | 0.42 | −0.96 | −0.91 |
| | | 3 | −0.12 | −0.94 | 0.68 |
| | | 4 | 1.00 | −1.00 | 0.89 |
| | | 5 | −1.00 | 0.20 | 0.86 |
| | | 6 | 0.92 | −0.57 | −0.99 |
| | | 7 | 0.95 | 1.00 | −0.15 |
| | | 8 | −0.39 | 0.95 | −1.00 |
| | | 9 | 0.97 | 0.69 | 1.00 |

The first column of Table 2 indicates a well-known RF pulse sequence for a block of rows in which the number of rows corresponds to the number of pulses in the known sequence, from n=3 for STEAM, to n=9 for MEGA-LASER. The second column of Table 2 indicates a minimum crushing strength, which is the crusher area felt by the least-crushed coherence pathway (i.e., all unwanted coherence pathways experience a crusher area at least as great as this number). The next column indicates the crusher pulse number (i), following the RF pulse of the same number, e.g., crusher 1 is applied sometime after RF1 (excitation pulse) and before RF2.

The next three columns indicate the relative area. A value of zero in any row of any of the last three columns indicates a corresponding one (m) of the gradient coils is not used in that crusher pulse (i). A positive integer relative area can still provide a non-integer amplitude if the duration time is not an integer or the reference is not an integer, or both. Also, any column can be multiplied by −1 without changing the crushing power, so it is always possible to obtain positive and negative integer, and non-integer crusher areas. What is unique to this method is that on a single crusher axes there is a mix of both negative and positive values, as well as the amplitude values being not integers of ½.

For PRESS and for STEAM, the crusher for the second coil is given twice the maximum possible area than the crusher for the 1st and $3^{rd}$ coils. For all other sequences, the maximum relative area is equal for all gradients. Note that any three crusher axes can be swapped, and any axis can be multiplied by negative 1 without changing the overall crushing strength. The method (although it works for PRESS and STEAM) is more advantageous for modern sequences which have >3 RF pulses, because the problem of designing crushers is not difficult for PRESS/STEAM.

A maximum coherence order of 2 was considered, thus it is possible that higher multiple quantum coherence pathways may not be sufficiently crushed, however as multiple quantum coherences are relatively unlikely to contaminate the measured signal this is likely an appropriate crusher scheme even with metabolites that have more than two coupled spins.

The algorithm developed here neglects the crushing effects of slice-select gradients as well as potential phase introductions across the voxel or sideband profile due to the RF pulse. These inherent crushing effects will be particularly large for pulses which employ adiabatic pulses, due to their strong non-linear phase profile, in addition to high bandwidth resulting in a high slice select gradient amplitude. It is for this reason that additional signal pathways are traditionally neglected in SLASER and LASER-based sequences. However, as these pathways can be subtle and difficult to detect, it is recommended to crush all unwanted pathways, as done herein. The only downside is a slight decrease in available signal-to-noise. Such a decrease in signal to noise is typically small due to the relatively small area of crushers compared to diffusion-sensitizing gradients, in addition to the substantially slower diffusion rate of all typically-measured metabolites compared to water.

When using the optimization algorithm the maximum coherence order should be used, however coherence orders above this should not be considered as higher coherence orders focuses crushing power towards non-physical pathways and thereby limits crushing power on relevant pathways. Furthermore, as can be seen from Table 1 it is evident that as the number of pulses in the experiment is increased, the minimum crushing power decreases, which is simply a result of the increased number of pathways. Thus depending on the number of pulses and maximum coherence order considered it is possible that three orthogonal crusher gradients may be insufficient to dephase all unwanted coherence pathways. Luckily for in vivo MRS, 9 RF pulses is the upper limit of commonly used sequences, and even with a maximum coherence order of 2, all unwanted coherence pathways can be crushed. For custom sequences with more pulses it would then become desirable to combine phase cycling with a proper gradient scheme in order to achieve signal from only the desired pathway.

3. COMPUTATIONAL HARDWARE OVERVIEW

Figure 9:
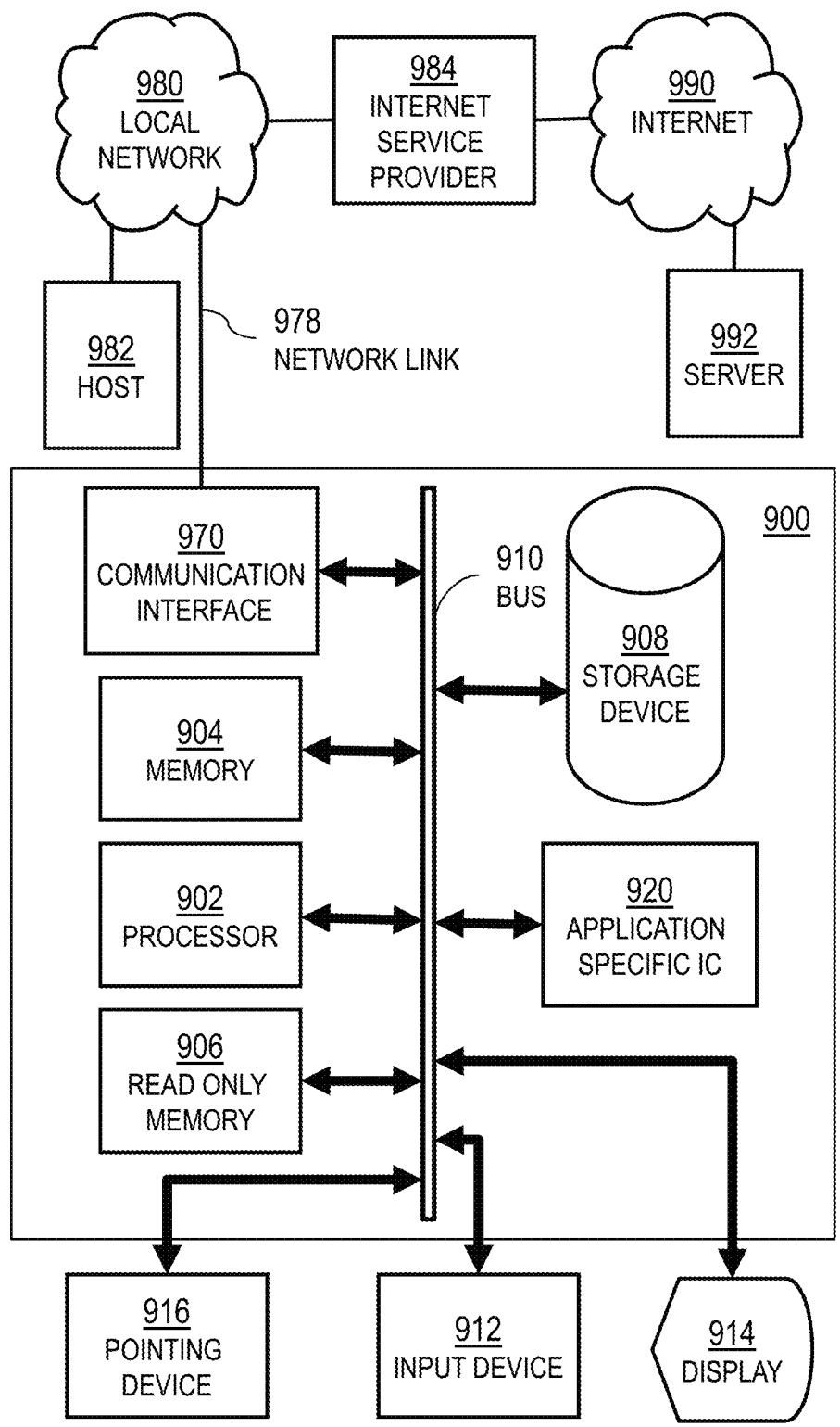
FIG. 9 is a block diagram that illustrates a computer system upon which an embodiment of the invention may be implemented.

FIG. 9 is a block diagram that illustrates a computer system 900 upon which an embodiment of the invention may be implemented. Computer system 900 includes a communication mechanism such as a bus 910 for passing information between other internal and external components of the computer system 900. Information is represented as physical signals of a measurable phenomenon, typically electric voltages, but including, in other embodiments, such phenomena as magnetic, electromagnetic, pressure, chemical, molecular atomic and quantum interactions. For example, north and south magnetic fields, or a zero and non-zero electric voltage, represent two states (0, 1) of a binary digit (bit). Other phenomena can represent digits of a higher base. A superposition of multiple simultaneous quantum states before measurement represents a quantum bit (qubit). A sequence of one or more digits constitutes digital data that is used to represent a number or code for a character. In some embodiments, information called analog data is represented by a near continuum of measurable values within a particular range. Computer system 900, or a portion thereof, constitutes a means for performing one or more steps of one or more methods described herein.

A sequence of binary digits constitutes digital data that is used to represent a number or code for a character. A bus 910 includes many parallel conductors of information so that information is transferred quickly among devices coupled to the bus 910. One or more processors 902 for processing information are coupled with the bus 910. A processor 902 performs a set of operations on information. The set of operations include bringing information in from the bus 910 and placing information on the bus 910. The set of operations also typically include comparing two or more units of information, shifting positions of units of information, and combining two or more units of information, such as by addition or multiplication. A sequence of operations to be executed by the processor 902 constitutes computer instructions.

Computer system 900 also includes a memory 904 coupled to bus 910. The memory 904, such as a random access memory (RAM) or other dynamic storage device, stores information including computer instructions. Dynamic memory allows information stored therein to be changed by the computer system 900. RAM allows a unit of information stored at a location called a memory address to be stored and retrieved independently of information at neighboring addresses. The memory 904 is also used by the processor 902 to store temporary values during execution of computer instructions. The computer system 900 also includes a read only memory (ROM) 906 or other static storage device coupled to the bus 910 for storing static information, including instructions, that is not changed by the computer system 900. Also coupled to bus 910 is a non-volatile (persistent) storage device 908, such as a magnetic disk or optical disk, for storing information, including instructions, that persists even when the computer system 900 is turned off or otherwise loses power.

Information, including instructions, is provided to the bus 910 for use by the processor from an external input device 912, such as a keyboard containing alphanumeric keys operated by a human user, or a sensor. A sensor detects conditions in its vicinity and transforms those detections into signals compatible with the signals used to represent information in computer system 900. Other external devices coupled to bus 910, used primarily for interacting with humans, include a display device 914, such as a cathode ray tube (CRT) or a liquid crystal display (LCD), for presenting images, and a pointing device 916, such as a mouse or a trackball or cursor direction keys, for controlling a position of a small cursor image presented on the display 914 and issuing commands associated with graphical elements presented on the display 914.

In the illustrated embodiment, special purpose hardware, such as an application specific integrated circuit (IC) 920, is coupled to bus 910. The special purpose hardware is configured to perform operations not performed by processor 902 quickly enough for special purposes. Examples of application specific ICs include graphics accelerator cards for generating images for display 914, cryptographic boards for encrypting and decrypting messages sent over a network, speech recognition, and interfaces to special external devices, such as robotic arms and medical scanning equipment that repeatedly perform some complex sequence of operations that are more efficiently implemented in hardware.

Computer system 900 also includes one or more instances of a communications interface 970 coupled to bus 910. Communication interface 970 provides a two-way communication coupling to a variety of external devices that operate with their own processors, such as printers, scanners and external disks. In general, the coupling is with a network link 978 that is connected to a local network 980 to which a variety of external devices with their own processors are connected. For example, communication interface 970 may be a parallel port or a serial port or a universal serial bus (USB) port on a personal computer. In some embodiments, communications interface 970 is an integrated services digital network (ISDN) card or a digital subscriber line (DSL) card or a telephone modem that provides an information communication connection to a corresponding type of telephone line. In some embodiments, a communication interface 970 is a cable modem that converts signals on bus 910 into signals for a communication connection over a coaxial cable or into optical signals for a communication connection over a fiber optic cable. As another example, communications interface 970 may be a local area network (LAN) card to provide a data communication connection to a compatible LAN, such as Ethernet. Wireless links may also be implemented. Carrier waves, such as acoustic waves and electromagnetic waves, including radio, optical and infrared waves travel through space without wires or cables. Signals include man-made variations in amplitude, frequency, phase, polarization or other physical properties of carrier waves. For wireless links, the communications interface 970 sends and receives electrical, acoustic or electromagnetic signals, including infrared and optical signals, that carry information streams, such as digital data.

The term computer-readable medium is used herein to refer to any medium that participates in providing information to processor 902, including instructions for execution. Such a medium may take many forms, including, but not limited to, non-volatile media, volatile media and transmission media. Non-volatile media include, for example, optical or magnetic disks, such as storage device 908. Volatile media include, for example, dynamic memory 904. Transmission media include, for example, coaxial cables, copper wire, fiber optic cables, and waves that travel through space without wires or cables, such as acoustic waves and electromagnetic waves, including radio, optical and infrared waves. The term computer-readable storage medium is used herein to refer to any medium that participates in providing information to processor 902, except for transmission media.

Common forms of computer-readable media include, for example, a floppy disk, a flexible disk, a hard disk, a magnetic tape, or any other magnetic medium, a compact disk ROM (CD-ROM), a digital video disk (DVD) or any other optical medium, punch cards, paper tape, or any other physical medium with patterns of holes, a RAM, a programmable ROM (PROM), an erasable PROM (EPROM), a FLASH-EPROM, or any other memory chip or cartridge, a carrier wave, or any other medium from which a computer can read. The term non-transitory computer-readable storage medium is used herein to refer to any medium that participates in providing information to processor 902, except for carrier waves and other signals.

Logic encoded in one or more tangible media includes one or both of processor instructions on a computer-readable storage media and special purpose hardware, such as ASIC 920.

Network link 978 typically provides information communication through one or more networks to other devices that use or process the information. For example, network link 978 may provide a connection through local network 980 to a host computer 982 or to equipment 984 operated by an Internet Service Provider (ISP). ISP equipment 984 in turn provides data communication services through the public, world-wide packet-switching communication network of networks now commonly referred to as the Internet 990. A computer called a server 992 connected to the Internet provides a service in response to information received over the Internet. For example, server 992 provides information representing video data for presentation at display 914.

The invention is related to the use of computer system 900 for implementing the techniques described herein. According to one embodiment of the invention, those techniques are performed by computer system 900 in response to processor 902 executing one or more sequences of one or more instructions contained in memory 904. Such instructions, also called software and program code, may be read into memory 904 from another computer-readable medium such as storage device 908. Execution of the sequences of instructions contained in memory 904 causes processor 902 to perform the method steps described herein. In alternative embodiments, hardware, such as application specific integrated circuit 920, may be used in place of or in combination with software to implement the invention. Thus, embodiments of the invention are not limited to any specific combination of hardware and software.

The signals transmitted over network link 978 and other networks through communications interface 970, carry information to and from computer system 900. Computer system 900 can send and receive information, including program code, through the networks 980, 990 among others, through network link 978 and communications interface 970. In an example using the Internet 990, a server 992 transmits program code for a particular application, requested by a message sent from computer 900, through Internet 990, ISP equipment 984, local network 980 and communications interface 970. The received code may be executed by processor 902 as it is received, or may be stored in storage device 908 or other non-volatile storage for later execution, or both. In this manner, computer system 900 may obtain application program code in the form of a signal on a carrier wave.

Various forms of computer readable media may be involved in carrying one or more sequence of instructions or data or both to processor 902 for execution. For example, instructions and data may initially be carried on a magnetic disk of a remote computer such as host 982. The remote computer loads the instructions and data into its dynamic memory and sends the instructions and data over a telephone line using a modem. A modem local to the computer system 900 receives the instructions and data on a telephone line and uses an infra-red transmitter to convert the instructions and data to a signal on an infra-red a carrier wave serving as the network link 978. An infrared detector serving as communications interface 970 receives the instructions and data carried in the infrared signal and places information representing the instructions and data onto bus 910. Bus 910 carries the information to memory 904 from which processor 902 retrieves and executes the instructions using some of the data sent with the instructions. The instructions and data received in memory 904 may optionally be stored on storage device 908, either before or after execution by the processor 902.

Figure 10:
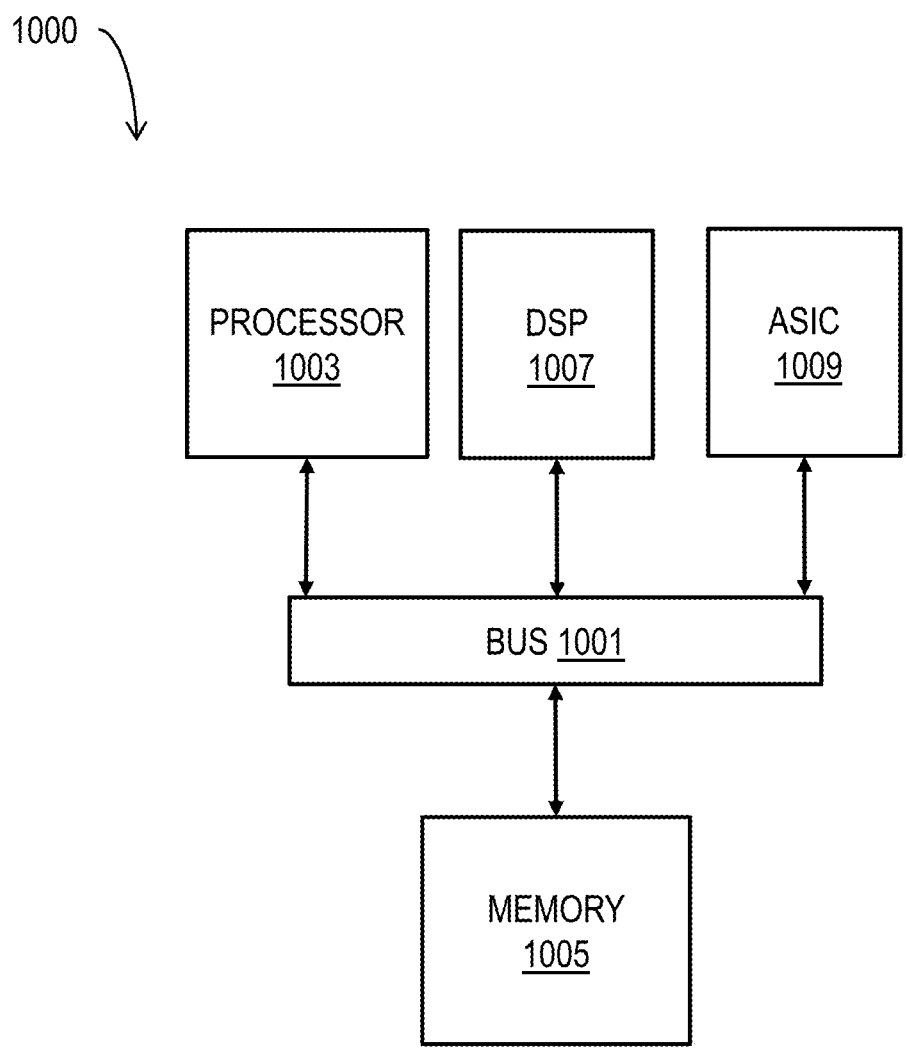
FIG. 10 illustrates a chip set upon which an embodiment of the invention may be implemented.

FIG. 10 illustrates a chip set 1000 upon which an embodiment of the invention may be implemented. Chip set 1000 is programmed to perform one or more steps of a method described herein and includes, for instance, the processor and memory components described with respect to FIG. 9 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set can be implemented in a single chip. Chip set 1000, or a portion thereof, constitutes a means for performing one or more steps of a method described herein.

In one embodiment, the chip set 1000 includes a communication mechanism such as a bus 1001 for passing information among the components of the chip set 1000. A processor 1003 has connectivity to the bus 1001 to execute instructions and process information stored in, for example, a memory 1005. The processor 1003 may include one or more processing cores with each core configured to perform independently. A multi-core processor enables multiprocessing within a single physical package. Examples of a multi-core processor include two, four, eight, or greater numbers of processing cores. Alternatively, or in addition, the processor 1003 may include one or more microprocessors configured in tandem via the bus 1001 to enable independent execution of instructions, pipelining, and multithreading. The processor 1003 may also be accompanied with one or more specialized components to perform certain processing functions and tasks such as one or more digital signal processors (DSP) 1007, or one or more application-specific integrated circuits (ASIC) 1009. A DSP 1007 typically is configured to process real-world signals (e.g., sound) in real time independently of the processor 1003. Similarly, an ASIC 1009 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 1003 and accompanying components have connectivity to the memory 1005 via the bus 1001. The memory 1005 includes both dynamic memory (e.g., RAM, magnetic disk, writable optical disk, etc.) and static memory (e.g., ROM, CD-ROM, etc.) for storing executable instructions that when executed perform one or more steps of a method described herein. The memory 1005 also stores the data associated with or generated by the execution of one or more steps of the methods described herein.

4. ALTERATIONS, DEVIATIONS AND MODIFICATIONS

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense. Throughout this specification and the claims, unless the context requires otherwise, the word "comprise" and its variations, such as "comprises" and "comprising," will be understood to imply the inclusion of a stated item, element or step or group of items, elements or steps but not the exclusion of any other item, element or step or group of items, elements or steps. Furthermore, the indefinite article "a" or "an" is meant to indicate one or more of the item, element or step modified by the article.

5. REFERENCES

The following reference are hereby each incorporated by reference as if fully set forth herein, except for terminology inconsistent with that used herein.

Andreychenko, A., Boer, V. O., Arteaga de Castro, C. S., Luijten, P. R. & Klomp, D. W. J. Efficient Spectral Editing at 7 T: GABA Detection with MEGA-sLASER. Magn Reson Med 68, 1018-1025 (2012).

Boer, V. O. et al. 7-T 1H MRS with adiabatic refocusing at short TE using radiofrequency focusing with a dual-channel volume transmit coil. NMR Biomed. 24, 1038-1046 (2011).

Bottomley, P. A. Spatial Localization in NMR Spectroscopy in Vivo. Ann N Y Acad Sci 508, 333-348 (1987).

Duyn, J. H. & Moonen, C. T. Fast proton spectroscopic imaging of human brain using multiple spin-echoes. Magn. Reson. Med. 30, 409-14 (1993).

Frahm, J., Merboldt, K.-D. & Hänicke, W. Localized Proton Spectroscopy using Stimulated Echoes. Jour Magn Reson 72, 502-508 (1987).

Garwood, M. & DelaBarre, L. The Return of the Frequency Sweep: Designing Adiabatic Pulses for Contemporary NMR. J. Magn. Reson. 153, 155-177 (2001).

Gruetter, R. Automatic, Localized in Vivo Adjustment of All First- and Second-Order Shim Coils. Magn Reson Med 29, 804-811 (1993).

Haase, A., Frahm, J., Hänicke, W. & Matthaei, D. 1H NMR chemical shift selective (CHESS) imaging. Phys Med Biol 30, 341-344 (1985).

Harada, M. et al. Diffusion-weighted in vivo localized proton MR spectroscopy of human cerebral ischemia and tumor. NMR Biomed 15, 69-74 (2002).

Hennig, J. Echoes—how to generate, recognize, use or avoid them in MR-imaging sequences. Part I: Fundamental and not so fundamental properties of spin echoes. Concepts Magn. Reson. Part B 3, 125-143 (1991).

Hennig, J. Echoes-Howto Generate, Recognize, Use or Avoid Them in MR-ImagingSequences Part II: Echoes in Imaging Sequences. Concepts Magn. Reson. Part B 3, 179-192 (1991).

Kingsley, P. B. Magnetic field gradients and coherence-pathway elimination. J. Magn. Reson. B 109, 243-50 (1995).

Landheer, K., Sahgal, A., Das, S. & Graham, S. J. Constrained Source Space MR Spectroscopy: Multiple Voxels, No Gradient Readout. Am J Neuroradiol 37, 1-8 (2015).

Landheer, K. et al. Diffusion-weighted J-resolved spectroscopy. Magn. Reson. Med. O, (2016). Landheer, K. et al. Diffusion-weighted J-resolved spectroscopy. Magn Reson Med 78, 1235-1245 (2017).

Lin, M., Kumar, A. & Yang, S. Two-Dimensional J-Resolved LASER and Semi-LASER Spectroscopy of Human Brain. Magn Reson Med 71, 911-920 (2014).

Mescher, M., Tannus, a., Johnson, M. O. & Garwood, M. Solvent Suppression Using Selective Echo Dephasing. J. Magn. Reson. Ser. A 123, 226-229 (1996).

Mescher, M., Merkle, H., Kirsch, J., Garwood, M. & Gruetter, R. Simultaneous in vivo spectral editing and water suppression. NMR Biomed 272, 266-272 (1998).

Mitschang, L., Ponstingl, H., Grindrod, D. & Oschkinat, H. Geometrical representation of coherence transfer selection by pulsed field gradients in high-resolution nuclear magnetic resonance. J. Chem. Phys. 102, 3089-3098 (1995).

Neji, R. & Schuster, C. Phase Cycling for Semi-Laser Single Voxel Spectroscopy. Proc. Intl. Soc. Mag. Reson. Med. 22, 3723 (2014).

Prinsen, H., de Graaf, R. a, Mason, G. F., Pelletier, D. & Juchem, C. Reproducibility measurement of glutathione, GABA, and glutamate: Towards in vivo neurochemical profiling of multiple sclerosis with MR spectroscopy at 7T. J Magn Reson Imag 45, 187-198 (2017).

Scheenen, T. W., Heerschap, A. & Klomp, D. W. Towards 1H-MRSI of the human brain at 7T with slice-selective adiabatic refocusing pulses. MAGMA 21, 95-101 (2008).

Scheenen, T. W. J., Klomp, D. W. J., Wijnen, J. P. & Heerschap, A. Short echo time 1H-MRSI of the human brain at 3T with minimal chemical shift displacement errors using adiabatic refocusing pulses. Magn Reson Med 59, 1-6 (2008).

Starck, G., Carlsson, A., Ljungberg, M. & Forssell-Aronsson, E. k-space analysis of point-resolved spectroscopy (PRESS) with regard to spurious echoes in in vivo (1)H MRS. NMR Biomed 22, 137-47 (2009).

Thomas, D. J., Mitschang, L., Simon, B. & Oshkinat, H. Signal Selection in High-Resolution NMR by Pulsed Field Gradients: II. The Design of Gradient Pulse Sequences. J. Magn. Reson. 137, 10-24 (1999).

W, B. et al. 3D GABA imaging with real-time motion correction, shim update and reacquisition of adiabatic spiral MRSI. Neuroimage 103, 290-302 (2014).

Woessner, D. E. Effects of Diffusion in Nuclear Magnetic Resonance Spin-Echo Experiments. J Chem Phys 34, 2057 (1961).

Zhu, J.-M. & Smith, I. C. P. Selection of coherence transfer pathways by pulsed-field gradients in NMR spectroscopy. Concepts Magn. Reson. 7, 281-291 (1995).

What is claimed is:

1. A method for operating a magnetic resonance device, the method comprising:

receiving first data that indicates a sequence of n radio frequency (RF) pulses with one or more target coherence pathways of spin states for making a magnetic resonance spectroscopy (MRS) measurement using a MRS device of a subject that has at least N≥1 coupled spin states of interest;

determining a negative non-integer amplitude for at least one intervening crusher pulse emitted from at least one spatial gradient magnetic coil, wherein the at least one intervening crusher pulse has a duration less than a time between successive pulses of the sequence of n RF pulses, and the intervening crusher pulse de-phases unwanted coherence pathways; and operating the magnetic resonance device using the at least one intervening pulse and the sequence of n RF pulses.

2. The method as recited in claim 1, wherein determining the negative non-integer amplitude further comprises determining amplitudes for all crusher pulses using an optimization algorithm.

3. The method as recited in claim 2, wherein using the optimization algorithm further comprises:

determining a matrix A of coherence pathways for n RF pulses and coherence order N comprising matrix elements Aij, $i \in (1, \ldots, n)$ and $j \in (1, \ldots, (2N+1)^n)$, each j representing a unique coherence pathway, j=K indicates the one or more target coherence pathways, and a value of Aij represents a coherence order of a jth pathway after i RF pulses;

determining values for elements Xmi of a matrix X, wherein each element Xmi describes a crusher area for each of 3 orthogonal axes, $m \in (1,2,3)$, after each of n pulses, wherein the crusher area is a product of a spatial gradient Gmi along axis m of an ith crusher pulse and a duration time τmi of the ith crusher pulse, further comprising determining for current values of elements of matrix X a vector D with elements Dj, having values that indicate a magnitude of a matrix product of XA for each coherence pathway j, determining a vector $\tilde{D}$ based on D with element $D_K$ constrained to zero, and iterating on values of the elements of matrix X to find a solution matrix $\tilde{X}$ that maximizes a measure of size of $\tilde{D}$ and falls within values achievable by the MRS device and that minimizes an absolute value of $D_K$; and producing output data that indicates solution matrix $\tilde{X}$, wherein the negative non-integer amplitude is based on at least one element of solution matrix.

4. The method as recited in claim 3, wherein operating the magnetic resonance device using the at least one intervening pulse further comprises sending signals that cause operation of the MRS device with crusher pulses having the areas of the elements of $\tilde{X}$.

5. The method as recited in claim 1, wherein the negative non-integer amplitude is not a negative integer multiple of ½.

6. A non-transitory computer-readable medium carrying one or more sequences of instructions, wherein execution of the one or more sequences of instructions by one or more processors causes the one or more processors to perform the steps of:

receive first data that indicates a sequence of n radio frequency (RF) pulses with one or more target coherence pathways of spin states for making a magnetic resonance spectroscopy (MRS) measurement using a MRS device of a subject that has at least N≥1 coupled spin states of interest;

determine a negative non-integer amplitude for at least one intervening crusher pulse emitted from at least one spatial gradient magnetic coil, wherein the at least one intervening crusher pulse has a duration less than a time between successive pulses of the sequence of n RF pulses, and the intervening crusher pulse de-phases unwanted coherence pathways; and operate the magnetic resonance device using the at least one intervening crusher pulse and the sequence of n RF pulses.

7. The non-transitory computer-readable medium as recited in claim 6, wherein to determine the negative non-integer amplitude further comprises to determine amplitudes for all crusher pulses using an optimization algorithm.

8. The non-transitory computer-readable medium as recited in claim 7, wherein to determine amplitudes for all crusher pulses using the optimization algorithm further comprises:

determine a matrix A of coherence pathways for n RF pulses and coherence order N comprising matrix elements Aij, $i \in (1, \ldots, n)$ and $j \in (1, \ldots, (2N+1)^n)$, each j representing a unique coherence pathway, j=K indicates the one or more target coherence pathways, and a value of Aij represents a coherence order of a jth pathway after i RF pulses;

determine values for elements Xmi of a matrix X, wherein each element Xmi describes a crusher area for each of 3 orthogonal axes, $m \in (1,2,3)$, after each of n pulses, wherein the crusher area is a product of a spatial gradient Gmi along axis m of an ith crusher pulse and a duration time τmi of the ith crusher pulse, further comprising determine for current values of elements of matrix X a vector D with elements Dj, having values that indicate a magnitude of a matrix product of XA for each coherence pathway j;

determine a vector $\tilde{D}$ based on D with element $D_K$ constrained to zero, and iterate on values of the elements of matrix X to find a solution matrix $\tilde{X}$ that maximizes a measure of size of $\tilde{D}$ and falls within values achievable by the MRS device and that minimizes an absolute value of $D_K$; and producing output data that indicates solution matrix $\tilde{X}$ wherein the negative non-integer amplitude is based on at least one element of solution matrix.

9. The non-transitory computer-readable medium as recited in claim 8, wherein to operate the magnetic resonance device using the at least one intervening pulse further comprises to send signals that cause operation of the MRS device with crusher pulses having the areas of the elements of $\tilde{X}$.

10. The non-transitory computer-readable medium as recited in claim 6, wherein the negative non-integer amplitude is not a negative integer multiple of ½.

11. A system comprising:

a magnetic resonance spectroscopy (MRS) device, at least one processor; and at least one memory including one or more sequences of instructions, the at least one memory and the one or more sequences of instructions configured to, with the at least one processor, cause the system to perform at least the following, receive first data that indicates a sequence of n radio frequency (RF) pulses with one or more target coherence pathways of spin states for making a magnetic resonance spectroscopy (MRS) measurement using a MRS device of a subject that has at least N≥1 coupled spin states of interest;

determine a negative non-integer amplitude for at least one intervening crusher pulse emitted from at least one spatial gradient magnetic coil, wherein the at least one intervening crusher pulse has a duration less than a time between successive pulses of the sequence of n RF pulses, and the intervening crusher pulse de-phases unwanted coherence pathways; and operate the magnetic resonance device using the at least one intervening crusher pulse and the sequence of n RF pulses.

12. The system as recited in claim 11, wherein to determine the negative non-integer amplitude further comprises to determine amplitudes for all crusher pulses using an optimization algorithm.

13. The system as recited in claim 12, wherein to determine the negative non-integer amplitude further comprises:

determine a matrix A of coherence pathways for n RF pulses and coherence order N comprising matrix elements Aij, i∈(1, ..., n) and j∈(1, ..., (2N+1)$^n$), each j representing a unique coherence pathway, j=K indicates the one or more target coherence pathways, and a value of Aij represents a coherence order of a jth pathway after i RF pulses;

determine values for elements Xmi of a matrix X, wherein each element Xmi describes a crusher area for each of 3 orthogonal axes, m (1,2,3), after each of n pulses, wherein the crusher area is a product of a spatial gradient Gmi along axis m of an ith crusher pulse and a duration time τmi of the ith crusher pulse, further comprising;

determine for current values of elements of matrix X a vector D with elements Dj, having values that indicate a magnitude of a matrix product of XA for each coherence pathway j;

determine a vector $\tilde{D}$ based on D with element $D_K$ constrained to zero, and iterate on values of the elements of matrix X to find a solution matrix $\tilde{X}$ that maximizes a measure of size of $\tilde{D}$ and falls within values achievable by the MRS device and that minimizes an absolute value of $D_K$; and produce output data that indicates solution matrix $\tilde{X}$, wherein the negative non-integer amplitude is based on at least one element of solution matrix.

14. The system as recited in claim 13, wherein to operate the magnetic resonance device using the at least one intervening pulse further comprises to send signals that cause operation of the MRS device with crusher pulses having the areas of the elements of $\tilde{X}$.

15. The system as recited in claim 11, wherein the negative non-integer amplitude is not a negative integer multiple of ½.

* * * * *